US012686612B2

(12) United States Patent (10) Patent No.: US 12,686,612 B2
Cho et al. (45) Date of Patent: Jul. 21, 2026

(54) ATTACHABLE MICROPHONE AND MANUFACTURING METHOD THEREFOR

(71) Applicants: CENTER FOR ADVANCED SOFT ELECTRONICS, Pohang-si (KR); POSTECH RESEARCH AND BUSINESS DEVELOPMENT FOUNDATION, Pohang-si (KR)

(72) Inventors: Kilwon Cho, Pohang-si (KR); Wonkyu Moon, Pohang-si (KR); Siyoung Lee, Pohang-si (KR); Junsoo Kim, Pohang-si (KR)

(73) Assignees: CENTER FOR ADVANCED SOFT ELECTRONICS, Pohang-si (KR); POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 201 days.

(21) Appl. No.: 18/695,090

(22) PCT Filed: Sep. 1, 2022

(86) PCT No.: PCT/KR2022/013078
§ 371 (c)(1),
(2) Date: Mar. 25, 2024

(87) PCT Pub. No.: WO2023/054917
PCT Pub. Date: Apr. 6, 2023

(65) Prior Publication Data
US 2024/0417240 A1 Dec. 19, 2024

(30) Foreign Application Priority Data
Sep. 29, 2021 (KR) ........................ 10-2021-0128701

(51) Int. Cl.
B81B 3/00 (2006.01)
B81C 1/00 (2006.01)
H04R 1/46 (2006.01)

(52) U.S. Cl.
CPC ........ B81B 3/0021 (2013.01); B81C 1/00182 (2013.01); H04R 1/46 (2013.01);
(Continued)

(58) Field of Classification Search
None
See application file for complete search history.

(56) References Cited

U.S. PATENT DOCUMENTS 9,352,959 B1 * 5/2016 Bulovic .................. H01S 5/187
2005/0254673 A1 * 11/2005 Hsieh ................... H04R 19/016
381/175
(Continued)

FOREIGN PATENT DOCUMENTS

JP 2010-268412 11/2010
KR 102110203 5/2020

OTHER PUBLICATIONS

Saewon Kang et al., "Transparent and conductive nanomembranes with orthogonal silver nanowire arrays for skin-attachable loudspeakers and microphones", Science Advences, Aug. 3, 2018, <URL: https://www.ncbi.nlm.nih.gov/pmc/articles/PMC6070362/>.

(Continued)

*Primary Examiner* — Walter F Briney, III
(74) *Attorney, Agent, or Firm* — LEX IP MEISTER, PLLC

(57) ABSTRACT
Proposed are an attachable microphone and a manufacturing method therefor. The attachable microphone includes a substrate (100) including a back chamber (110) and a first frame member (120), a back plate part (200) being disposed
(Continued)

on the substrate (100) and including a plurality of first through holes (210) and a back plate (220), a first electrode part (300) being disposed on the back plate part (200) and having a plurality of second through holes (310) and a first electrode member (320), a support part (400) being disposed on the first electrode part (300) and including a front chamber (410) and a second frame member (420), a second electrode part (500) being disposed on the support part (400) and including a second electrode member (510), and a diaphragm (600) being disposed on the second electrode part (500) and including a thin film (610).

18 Claims, 25 Drawing Sheets

(52) U.S. Cl.
CPC .................. *B81B 2201/0257* (2013.01); *B81B 2203/0127* (2013.01); *B81B 2203/0353* (2013.01); *B81B 2203/04* (2013.01); *B81C 2201/0107* (2013.01); *B81C 2201/013* (2013.01); *B81C 2201/0191* (2013.01); *H04R 2307/025* (2013.01)

(56) References Cited

U.S. PATENT DOCUMENTS

2006/0238110 A1* 10/2006 Shirai ..................... C09K 11/06
313/503
2017/0171652 A1 6/2017 Yoo

OTHER PUBLICATIONS

KIPO, Office Action of KR 10-2021-0128701 dated Nov. 18, 2022.
KIPO, PCT Search Report of PCT/KR2022/013078 dated Dec. 13, 2022.
Dietmar Hohm et al., "A subminiature condenser microphone with silicon nitride membrane and silicon back plate", J. Acoust. Soc. Am. 85, 476-480 (1989).
Michael Pedersen et al., "High-Performance Condenser Microphone with Fully Integrated CMOS Amplifier and DC-DC Voltage Converter", Journal of Microelectromechanical Systems, vol. 7, No. 4, Dec. 1998.
Patrick Richard Scheeper et al., "A New Measurement Microphone Based on MEMS Technology", Journal of Microelectromechanical Systems, vol. 12, No. 6, Dec. 2003.

David T. Martin et al., "A Micromachined Dual-Backplate Capacitive Microphone for Aeroacoustic Measurements", Journal of Microelectromechanical Systems, vol. 16, No. 6, Dec. 2007.
Chien-Hsin Huang et al., "Implementation of the CMOS MEMS Condenser Microphone with Corrugated Metal Diaphragm and Silicon Back-Plate", Sensors 2011, 11, 6257-6269, Jun. 10, 2011; doi:10.3390/s110606257.
Alfons Dehé et al., "The Infineon Silicon MEMS Microphone", AMA Conferences 2013, May 14, 2013-May 16, 2013, Nümberg, Proceedings SENSOR 2013, DOI 10.5162/sensor2013/A4.3.
Dejan Todorović et al., "Multilayer graphene condenser microphone", 2D Mater. 2 (2015) 045013, Nov. 26, 2015, doi:10.1088/2053-1583/2/4/045013.
Jaewoo Lee et al., "A concave-patterned TiN/PECVD-Si3N4 /TiN diaphragm MEMS acoustic sensor based on a polyimide sacrificial layer", J. Micromech. Microeng. 25 (2015) 125022 (13pp), Nov. 9, 2015, doi:10.1088/0960-1317/25/12/125022.
Md Osman Goni Nayeem et al., "All-nanofiber-based, ultrasensitive, gas-permeable mechanoacoustic sensors for continuous long-term heart monitoring", PNAS, vol. 117, No. 13, 7063-7070, Mar. 31, 2020.
Hengyu Guo et al., "A highly sensitive, self-powered triboelectric auditory sensor for social robotics and hearing aids", Sci. Robot. 3, eaat2516 (2018), Jul. 25, 2018.
Fangqi Chen et al., "A novel triboelectric nanogenerator based on electrospun polyvinylidene fluoride nanofibers for effective acoustic energy harvesting and self-powered multifunctional sensing", Nano Energy 56 (2019) 241-251, Nov. 22, 2018.
Chenhong Lang et al., "High-sensitivity acoustic sensors from nanofibre webs", Nat Commun 7, 11108 (2016), Mar. 23, 2016; https://doi.org/10.1038/ncomms11108.
Saewon Kang et al., "Transparent and conductive nanomembranes with orthogonal silver nanowire arrays for skin-attachable loud-speakers and microphones", Sci. Adv. 2018;4: eaas8772, Aug. 3, 2018.
Hee Seung Wang et al., "Biomimetic and flexible piezoelectric mobile acoustic sensors with multiresonant ultrathin structures for machine learning biometrics", Sci. Adv. 2021; 7 : eabe5683, Feb. 12, 2021.
Jongmoon Jang et al., "A microelectromechanical system artificial basilar membrane based on a piezoelectric cantilever array and its characterization using an animal model", Sci Rep 5, 12447 (2015), Jul. 31, 2015, https://doi.org/10.1038/srep12447.
Nivedita Arora et al., "SATURN: a Thin and Flexible Self-powered Microphone Leveraging Triboelectric Nanogenerator", Proc. ACM Interact. Mob. Wearable Ubiquitous Technol., vol. 2, No. 2, Article 60, Jun. 2018, https://doi.org/10.1145/3214263.

* cited by examiner

10

610(600)
510(500)
410 ) 400
420
310 ) 300
320
700
210 ) 200
220
110 ) 100
120

Diaphragm
Support
Perforated
back-plate

[Transferring method 1]
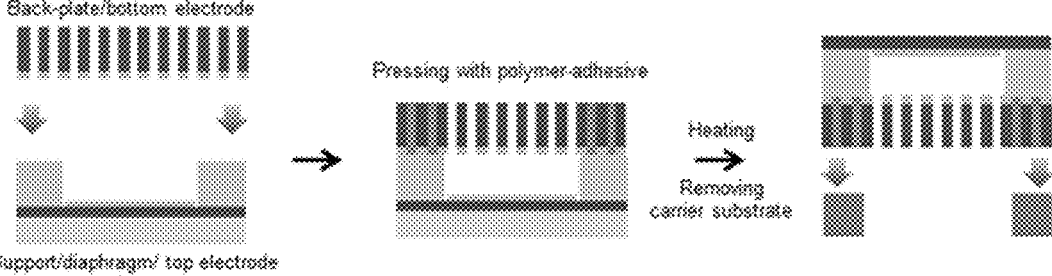
[Transferring method 2]
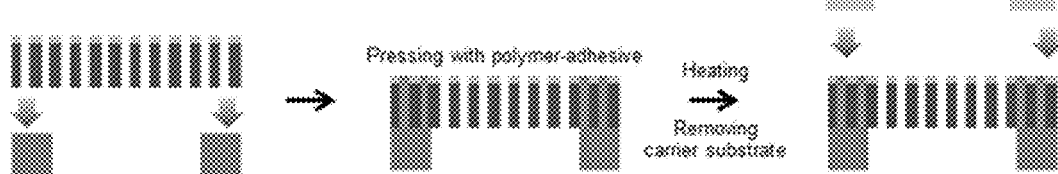
[Transferring method 3]
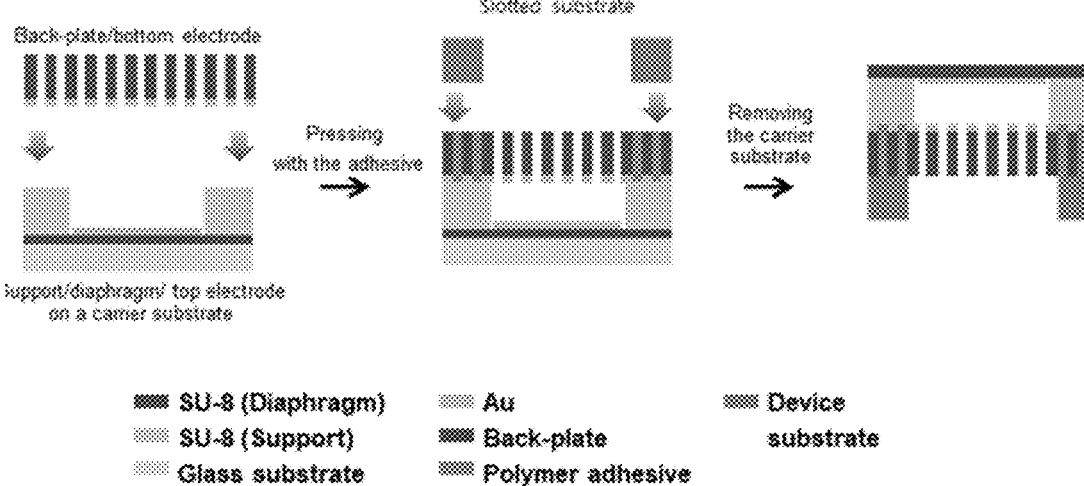
SU-8 (Diaphragm)      Au          Device
SU-8 (Support)        Back-plate       substrate
Glass substrate       Polymer adhesive
FIG. 9

FIG. 12
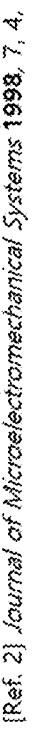
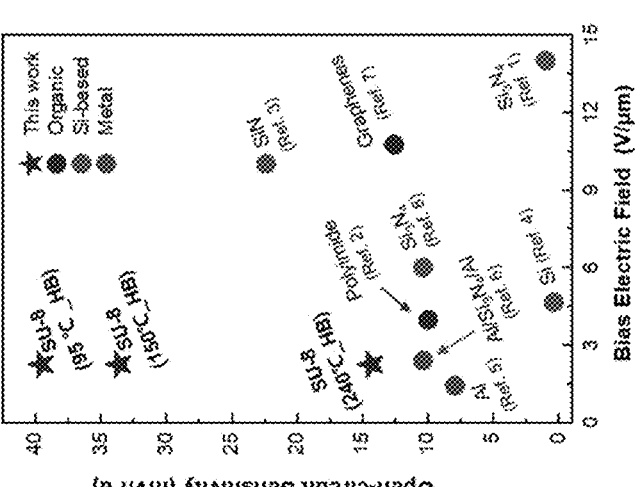
[Ref. 1] *The Journal of the acoustical Society of America* 1989, 85, 1, 476
[Ref. 2] *Journal of Microelectromechanical Systems* 1998, 7, 4, 387
[Ref. 3] *Journal of Microelectromechanical Systems* 2003, 12, 6, 880
[Ref. 4] *Journal of Microelectromechanical Systems* 2007, 16, 6, 1289
[Ref. 5] *Sensors(Basel)* 2011, 11, 6, 6257
[Ref. 6] *Sensors(IEEE)* 2013, 10.1109/ICSENS.2013.6688399
[Ref. 7] *2D Materials* 2015, 2, 45013
[Ref. 8] *Journal of Micromechanics and Microengineering* 2015, 25, 12, 125022

FIG. 16

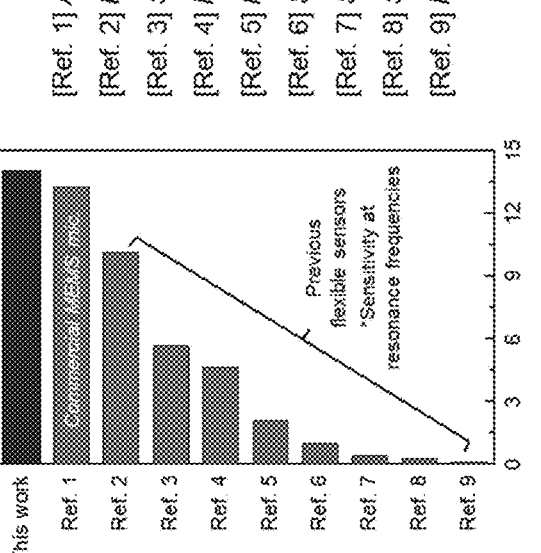

Sensitivity per area [mV/Pa/mm²]

This work
Ref. 1
Ref. 2
Ref. 3
Ref. 4
Ref. 5
Ref. 6
Ref. 7
Ref. 8
Ref. 9

Previous flexible sensors
*Sensitivity at resonance frequencies

[Ref. 1] AMA Conference 2013, 10.5162/sensor2013/A4.3

[Ref. 2] PNAS, 2020, 117, 13, 7063

[Ref. 3] Science Robotics 2018, 3, eaat2516

[Ref. 4] Nano Energy 2019, 56, 241

[Ref. 5] Nature Communications 2016, 7, 11108

[Ref. 6] Science Advances 2018, 4, eaas8772

[Ref. 7] Science Advances 2021, 7, eabe5683

[Ref. 8] Scitific Reports 2015, 5, 12447

[Ref. 9] Proc. ACM Interact. Mob. Wearable Ubiquitous Technol. 2018, 2, 2, 60

FIG. 17
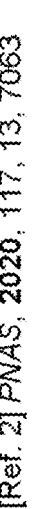
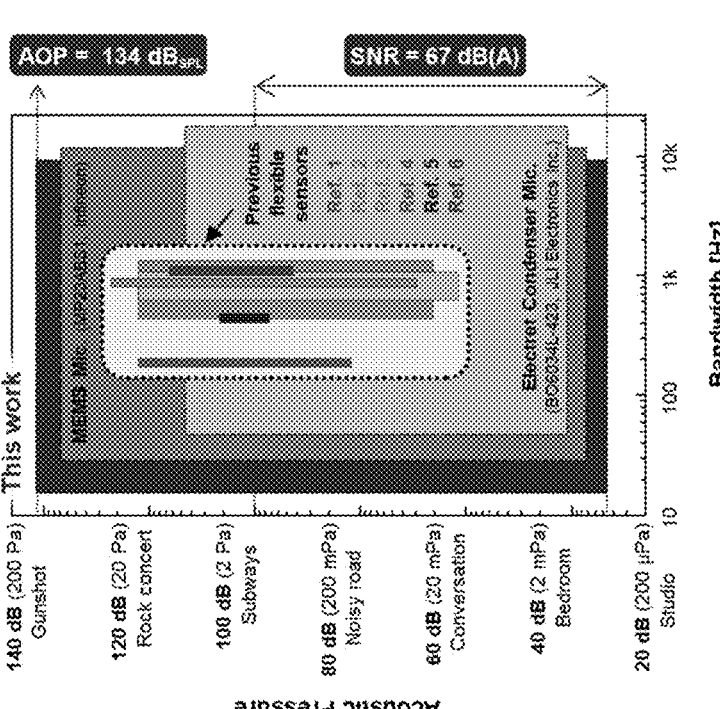
[Ref. 1] *Nature Communications* 2016, 7, 11108
[Ref. 2] *PNAS,* 2020, 117, 13, 7063
[Ref. 3] *Science Advances* 2021, 7, eabe5683
[Ref. 4] *Nano Energy* 2019, 56, 241
[Ref. 5] *Science Advances* 2018, 4, eaas8772
[Ref. 6] *Science Robotics* 2018, 3, eaat2516

ATTACHABLE MICROPHONE AND MANUFACTURING METHOD THEREFOR

TECHNICAL FIELD

The present disclosure relates to an attachable microphone and a manufacturing method therefor. More particularly, the present disclosure relates to an attachable ultra-small microphone and a manufacturing method therefor, the attachable ultra-small microphone being formed of a polymer, being manufactured by a thin film transferring-based manufacturing method so that the attachable ultra-small microphone has a high and constant sensitivity in an audible frequency range, and being capable of being attached to various surfaces including skin, a curved surface, and so on.

BACKGROUND ART

Hearing is one of the representative human senses, and there is an advantage that sensory information can be received through sound pressure in all directions even from an invisible place or a distant place. Therefore, various microphones capable of sensing sound pressure have been developed, and the various microphones have been applied to many fields such as telecommunication fields, industrial manufacturing fields, medical fields, health care fields, military defense fields, and so on.

Recently, as the fields of Internet of Things (IoT), Human-Machine Interaction (HMI), and Artificial Intelligence (AI) have been developed, many companies such as Samsung, Apple, Google, Amazon, and so on are showing growing interest in human-friendly sound devices.

Therefore, in order to clearly understand a person's voice and the surrounding environment, the microphone is required to have a sensing performance for a sound pressure, and is required to be capable of being freely harmonized with the surrounding environment and to value the user's convenience and comfort.

In order to satisfy this demand, flexible microphones, such as piezoelectric, frictional electricity, capacitance, and so on, that sense sound pressure in various ways and that are capable of being attached to human skin have been developed through various domestic and foreign researchers.

However, the flexible devices reported so far do not satisfy basic performances of a microphone for sensing sound pressure. The conventional flexible devices do not have a flat frequency response rate that means a constant sensitivity according to a frequency of sound pressure, and sensing of voices of various pitches is limited since the conventional flexible devices have a resonance phenomenon at a specific frequency.

In addition, in the conventional flexible devices, when a sound of 1 kHz and 1 Pa is sensed, a Signal to Noise Ratio (SNR) that indicates a ratio of a signal to noise is not capable of being provided, or voices as low as 30 dB are difficult to be sensed due to such devices having a small size. Furthermore, in the conventional flexible devices, an Acoustic Overload Point (AOP) that means a maximum pressure size in which a waveform of sound pressure is maintained and is capable of being sensed is not capable of being provided, and the conventional flexible devices does not operate stably in loud ambient sound environments exceeding 120 dB.

In addition, since the conventional flexible devices do not have a sensitivity linearity that indicates a constant sensitivity to a size of sound pressure, the conventional flexible devices are not capable of sensing various sizes of sound pressure in an original shape. Furthermore, since the reported flexible microphones have large areas of at least several cm$^2$, the reported flexible microphones are limited to be attached to surfaces that are rough or curved like skin even if the reported flexible microphones have a thin-film-type structure.

In order to solve these problems, it is necessary to manufacture a microphone having a flat frequency response rate and a sensitivity linearity in a wide range of an audible frequency/size, having a high SNR and a sound pressure sensing performance at an AOP, and having a structure which is thin and which has a very small area so that the microphone is capable of being attached to various surfaces such as skin, a curved surface, and so on.

MEMS microphones, which are used in various wireless applications such as mobile phones, home appliances, vehicles, and so on, are also being attracting attention as human-friendly sound devices on the basis of ultra-miniaturization and mass production.

However, since the conventional MEMS microphones are manufactured using a brittle silicon-based material, there is a risk that the conventional MEMS microphones may break when the conventional MEMS microphones are attached to skin or a rough surface, so that it is difficult to use the conventional MEMS microphones.

In addition, the silicon-based material has a strong residual stress and a strong mechanical stiffness. Therefore, although many researchers have designed various microphone structures and circuits so far, there have been limitations in increasing a sensing performance to the level of large condenser microphones for professional voice recording.

In addition, in a silicon-based manufacturing process, the silicon-based material ranging from several to several hundreds of μm is required to be deposited, patterned, and etched in order to secure a sophisticated microphone structure. Each process is very complicated, and requires substantial money and time.

Therefore, it is necessary to develop a manufacturing method for cost/time-efficient development of a microphone having a high sensing performance on the basis of an organic material which has a residual stress and a mechanical stiffness lower than a residual stress and a mechanical stiffness of the silicon-based material, and which is more ductile and easy to process.

DISCLOSURE

Technical Problem

Accordingly, the present disclosure has been made keeping in mind the above problems occurring in the related art, and an objective of the present disclosure is to provide an attachable ultra-small microphone formed on the basis of a diaphragm structure and a polymer material crosslinked by a thin film transferring-based manufacturing method, the attachable ultra-small microphone having a high and constant sensitivity within an audible frequency region (15 Hz~10,000 Hz) and a size range (29 dB$_{SPL}$~134 dB$_{SPL}$) and being capable of being attached to various surfaces including skin, a curved surface, and so on.

In addition, another objective of the present disclosure is to provide an attachable ultra-small microphone capable of being attached to various surfaces such as skin, a curved surface, and so on the basis of being made of an organic material and having a thin film shape having a thin and small structure.

In addition, still another objective of the present disclosure is to provide a manufacturing method for an attachable ultra-small microphone, the manufacturing method using a polymer material that costs less than a conventional silicon material and a thin film transferring-based manufacturing method, and the manufacturing method being economical in terms of time and cost compared to a silicon-based manufacturing process of a conventional MEMS microphone.

Technical Solution

According to one aspect of the present disclosure, there is provided an attachable microphone 10 including: a substrate 100 including a back chamber 110 having a first cylindrical hollow, the substrate 100 including a first frame member 120 which surrounds the back chamber 110 and which has a first polymer or an inorganic material; a back plate part 200 disposed on the substrate 100, the back plate part 200 including a plurality of first through holes 210 and including a back plate 220 that includes a second polymer; a first electrode part 300 disposed on the back plate part 200, the first electrode part 300 having a plurality of second through holes 310 and including a first electrode member 320; a support part 400 disposed on the first electrode part 300, the support part 400 including a front chamber 410 having a second cylindrical hollow, and the support part 400 including a second frame member 420 which includes a third polymer and which surrounds the front chamber 410; a second electrode part 500 disposed on the support part 400, the second electrode part 500 including a second electrode member 510; and a diaphragm 600 disposed on the second electrode part 500, the diaphragm 600 including a thin film 610 that includes a fourth polymer.

In addition, the attachable microphone may further include an adhesive part 700 including an adhesive agent, the adhesive part 700 may penetrate the back plate part 200 and the first electrode part 300, and the adhesive part 700 may respectively adhere the substrate 100 and the support part 400.

In addition, the back chamber 110 may include any one shape selected from the group consisting of a cylindrical shape, an elliptical cylindrical shape, a polygonal cylindrical shape, a star-like cylindrical shape, and a combination thereof.

In addition, a size of a diameter of the first cylindrical hollow may be 1 to 1.5 times a size of a diameter of the second cylindrical hollow of the support part.

In addition, a height of the first cylindrical hollow may be 0.01 mm to 1 mm.

In addition, an area of the first cylindrical hollow from an upper part of the first cylindrical hollow to a lower part of the first cylindrical hollow may be the same or may gradually increase.

In addition, the attachable microphone may further include an attachment layer 800 positioned on the substrate 100 in a direction opposite to the back plate part 200, and a thickness of the attachment layer 800 may be 0.01 mm to 1 mm.

In addition, the first polymer may include at least one selected from the group consisting of polyparaxylylene (parylene, poly(p-xylylene)), polyethylene terephthalate, polybutylene terephthalate, polyethylene naphthalate, polyethylene, polypropylene, polystyrene, polycarbonate, polyamide, polyimide, polyurea, polyurethane, polydimethylsiloxane, polystyrene butadiene styrene, polystyrene ethylene butylene styrene, polymethyl methacrylate, acrylonitrile butadiene styrene resin, epoxy resin, acrylic resin, novolac resin, formaldehyde resin, phenolic resin, phenol-formaldehyde resin, polyester resin, bismaleimide triazine resin, polyimide resin, diphenylene ether resin, polycyanate resin, polyolefin resin, and imide-styrene resin. Furthermore, the inorganic material may include at least one selected from the group consisting of silicon, silicon nitride, and silicon oxide.

In addition, the second polymer, the third polymer, and the fourth polymer may be the same or different from each other, and may independently include at least one selected from the group consisting of epoxy resin, acrylic resin, novolac resin, formaldehyde resin, polymethyl methacrylate, polyparaxylylene (parylene, poly(p-xylylene)), polyethylene terephthalate, polybutylene terephthalate, polyethylene naphthalate, polyethylene, polypropylene, polystyrene, polycarbonate, polyamide, polyimide, polyurea, polyurethane, polydimethylsiloxane, polystyrene butadiene styrene, polystyrene-acrylate copolymer, polystyrene ethylene butylene styrene, and polyacrylonitrile butadiene styrene.

In addition, in the back plate part 200, a gap between adjacent through holes among the plurality of through holes may be 15 μm to 150 μm, and a diameter of each of the plurality of through holes may be 10 μm to 100 μm.

In addition, a thickness of the back plate part 200 may be 10 μm to 500 μm, a thickness of the support part 400 may be 0.1 μm to 20 μm, a thickness of the diaphragm 600 may be 0.1 μm to 10 μm.

In addition, the Young's modulus of the back plate 220 may be at least 100 MPa, the Young's modulus of the thin film 610 may be 1 MPa to 10 GPa In addition, the plurality of first through holes 210 of the back plate part 200 may be in contact with the plurality of second through holes 310 of the first electrode part 300, a height direction of the first through holes 210 may be perpendicular to a surface of the first electrode part 300, and the second cylindrical hollow of the front chamber 410 may be in contact with the second electrode part 500, and a height direction of the second cylindrical hollow may be perpendicular to the surface of the first electrode part 300 and to a surface of the second electrode part 500.

In addition, a diameter of the second cylindrical hollow may be 50 μm to 3,000 μm.

In addition, the first electrode member and the second electrode member may be the same or different from each other, and may independently include at least one selected from the group consisting of gold, titanium, platinum, nickel, palladium, copper, zinc, cadmium, iron, cobalt, iridium, tin, gallium, aluminum, manganese, chromium, molybdenum, tungsten, graphene, carbon nanotube, graphite, indium tin oxide, and PEPOT:PSS.

In addition, the attachable microphone may have a horizontal length of 1.4 mm to 10 mm, a vertical length of 1.4 mm to 10 mm, and a thickness of 50 μm to 5 mm.

In addition, the attachable microphone may further include an attachment layer 800 positioned on the substrate 100 in a direction opposite to the back plate part 200.

According to another aspect of the present disclosure, there is provided a microphone array including a plurality of attachable microphones.

According to another aspect of the present disclosure, there is provided a manufacturing method for an attachable microphone, the manufacturing method including: (a) a process of fabricating the substrate 100 which includes the back chamber 110 having the first cylindrical hollow and which includes the first frame member 120 surrounding the back chamber 110 and including the first polymer; (b) a process of fabricating a lower plate including the back plate part 200 and the first electrode part 300, the back plate part 200 including the plurality of first through holes 210 and the back plate 220 that includes the second polymer, the first electrode part 300 being disposed on the back plate part 200 and including the plurality of second through holes 310 and the first electrode member 320; (c) a process of fabricating an upper plate including the support part 400, the second electrode part 500, and the diaphragm 600, the support part 400 including the front chamber 410 that has the second cylindrical hollow and including the second frame member 420 which includes the third polymer and which surrounds the front chamber 410, the second electrode part 500 being disposed on the support part 400 and including the second electrode member 510, the diaphragm 600 being disposed on the second electrode part 500 and including the thin film 610 that includes the fourth polymer; and (d) a process of fabricating the attachable microphone having a substrate/lower plate/upper plate structure by using thin film transferring.

In addition, the process (d) may be a process of forming the substrate/lower plate/upper plate structure by using thin film transferring and of fabricating the attachable microphone by forming the adhesive part 700 that includes the adhesive agent. Furthermore, the adhesive part 700 may penetrate the back plate part 200 and the first electrode part 300, and the adhesive part 700 may respectively adhere the substrate 100 and the support part 400.

In addition, the process (b) may include: (b-1) a process in which a sacrificial layer is formed on a base, and the back plate part 200 having the plurality of first through holes 210 and having the back plate 220 that includes the second polymer is formed on the sacrificial layer, thereby forming a base/sacrificial layer/back plate part structure; (b-2) a process of forming a single back plate part 200 by etching the sacrificial layer of the base/sacrificial layer/back plate part structure; and (b-3) a process in which the first electrode part 300 having the plurality of second through holes 310 and the first electrode member 320 is formed on the back plate part 200, thereby forming the lower plate having the back plate part 200 and the first electrode part 300.

In addition, the process (c) may include: (c-1) a process in which the sacrificial layer is formed on the base, and the diaphragm 600 having the thin film 610 that has the fourth polymer is formed on the sacrificial layer, thereby forming a base/sacrificial layer/diaphragm structure; (c-2) a process in which the second electrode part 500 having the second electrode member 510 is formed on the diaphragm of the base/sacrificial layer/diaphragm structure, thereby forming a base/sacrificial layer/diaphragm/second electrode part structure; (c-3) a process in which the support part 400 having the front chamber 410 that has the second cylindrical hollow and having the second frame member 420 which has the third polymer and which surrounds the front chamber 410 is formed on the second electrode part 500, thereby forming a base/sacrificial layer/diaphragm/second electrode part/support part structure; and (c-4) a process of fabricating the upper plate including a diaphragm/second electrode part/support part structure by etching the sacrificial layer of the base/sacrificial layer/diaphragm/second electrode part/support part structure.

In addition, the process (d) may include: (1) a process in which the base is disposed on the diaphragm 600 in a direction opposite to the second electrode part 500, thereby forming a base/diaphragm 600/second electrode part 500/support part 400 structure; (2) a process in which the first electrode part 300 of the lower plate is disposed on the support part 400 of the base/diaphragm 600/second electrode part 500/support part 400 structure, thereby forming a base/upper plate/lower plate structure; (3) a process in which an upper plate/lower plate structure is separated from the base/upper plate/lower plate structure; and (4) a process in which the back plate part 200 of the upper plate/lower plate structure is disposed on the substrate 100, thereby fabricating the attachable microphone having the substrate/lower plate/upper plate structure.

In addition, the process (d) may include: (1') a process in which the back plate part 200 of the lower plate is disposed on the substrate 100, thereby forming a substrate/lower plate structure; and (2') a process in which the support part 400 of the upper plate is disposed on the first electrode part 300 of the substrate/lower plate structure, thereby fabricating the attachable microphone having the substrate/lower plate/upper plate structure.

In addition, the process (d) may include: (1") a process in which the base is disposed on the diaphragm 600 of the upper plate in a direction opposite to the second electrode part 500, thereby forming the base/diaphragm 600/second electrode part 500/support part 400 structure; (2") a process in which the first electrode part 300 of the lower plate is disposed on the support part 400 of the base/diaphragm 600/second electrode part 500/support part 400 structure, thereby forming the base/upper plate/lower plate structure; (3") a process in which the substrate 100 is disposed on the lower plate of the base/upper plate/lower plate structure, thereby forming a base/upper plate/lower plate/substrate structure; and (4") a process in which an upper plate/lower plate/substrate structure is separated from the base/upper plate/lower plate/substrate structure, thereby fabricating the attachable microphone having the substrate/lower plate/upper plate structure.

In addition, after the process (d), the manufacturing method for the attachable microphone may further include (e) a process of forming the attachment layer 800 on the substrate in a direction opposite to the back plate part.

Advantageous Effects

The attachable microphone of the present disclosure has a high and constant sensitivity within an audible frequency range (15 Hz to 10,000 Hz) and a size range (29 dB$_{SPL}$ to 123 dB$_{SPL}$), and is capable of being attached to various surfaces including skin, a curved surface, and so on.

In addition, the attachable microphone of the present disclosure is capable of being attached to various surfaces such as skin, a curved surface, and so on the basis of being made of an organic material and having a thin film shape having a thin and small structure.

In addition, since the attachable microphone and the manufacturing method therefor apply the thin film transferring-based manufacturing method and the polymer material that costs less than the conventional silicon material, there is an economical effect in terms of time and cost compared to the silicon-based manufacturing process of the conventional MEMS microphone.

FIG. 12 is a graph showing open-circuit sensitivities of attachable microphones (SU-8, star shape) manufactured according to embodiments of the present disclosure and of attachable microphones (Ref. 1 to Ref. 8) described in reference papers. Referring to FIG. 12, it can be seen that the open-sensitivities of the microphones of the present disclosure are larger than that of the conventional MEMS microphones having similar structures and similar operation methods. In addition, in the microphones of the present disclosure, it can be seen that sizes of the sensitivities compared to the applied electric field are high. Such a result may be described in terms of the material and the structure of the microphone. First, epoxy resin is used as a material of the diaphragm, and has a lower residual stress than that of metal or silicon-based materials. Therefore, the diaphragm has a small stiffness even in a plate structure rather than a complicated corrugated structure and a spring structure of the conventional microphone. In addition, by using the thin film transferring-based manufacturing method of the present disclosure, the microphone in which a large cylindrical hollow is formed and in which the distance between the diaphragm and the back plate is small is capable of being manufactured, so that the microphone of the present disclosure has an open-circuit sensitivity greater than open-circuit sensitivities of the conventional microphones.

FIG. 16 is a graph showing a comparison of a sensitivity per unit area of the attachable microphone (This work) manufactured according to an embodiment of the present disclosure, a conventional commercial MEMS microphone (Ref. 1), and flexible microphones (Ref. 2 to Ref. 9) described in reference papers. In order to stably attach a microphone to a surface that is rough or curved like skin, the microphone is required to have a small size and a high sound sensing performance. Therefore, the performance was compared on the basis of the sensitivity per unit area.

Referring to FIG. 16, the attachable sound sensors (Ref. 2 to Ref. 9) previously researched and developed are mostly configured to sense sound by using resonant vibration at a specific frequency rather than all audible frequencies. Although the attachable sound sensors (Ref. 2 to Ref. 9) have sensitivities of several volts per 1 Pa (94 dB), sensitivities per unit area are only about 10 mV/Pa/mm² at most due to large areas, and have sensing performances lower than a sensing performance of the commercial MEMS microphone (Ref. 1). This means that when the commercial MEMS microphone is manufactured as an array such as a sensing area of the attachable sound sensor, the commercial MEMS microphone may have a larger sensitivity.

On the other hand, the microphone (This work) of the present disclosure has a sensitivity higher than a sensitivity of the commercial MEMS microphone (Ref. 1) even considering the unit area. The reason why the microphone (This work) of the present disclosure has the high sensitivity is because, unlike the conventional MEMS microphones manufactured using silicon materials, the microphone (This work) was manufactured by using organic materials.

FIG. 17 is a graph showing a comparison of sound pressure and a bandwidth of the attachable microphone (This work) manufactured according to an embodiment of the present disclosure, a conventional commercial MEMS microphone (MP23ABS1, Infineon), a commercial electret condenser microphone (BO6034L-423, JLI Electronics Inc.), and flexible sound sensors (Ref. 1 to Ref. 6) described in reference papers. A wider range of sound pressure and frequency means that various voices such as smaller voices, larger voices, lower-pitched voices, and higher-pitched voices are capable of being sensed. Therefore, it can be said that the wider the range, the better the sensing performance.

Referring to FIG. 17, since the flexible sound sensors developed so far mainly use only sound sensing at resonant frequencies, a frequency range having a constant sensitivity is very narrow, and a sound pressure range having a constant sensitivity is not wide. However, the microphone of the present disclosure has a wider range of sound pressure and frequency having a slightly constant sensitivity than that of the conventional MEMS microphone or the electret condenser microphone. Therefore, it can be said that the microphone developed in the present disclosure has a commercially available level of sensing performance that is not realized by the conventional flexible sound sensors.

DESCRIPTION OF DRAWINGS

Since the accompanying drawings are for reference in describing exemplary embodiments of the present disclosure, the technical spirit of the present disclosure should not be construed as being limited to the accompanying drawings.

FIG. 5b is a graph based on the image in FIG. 5a.

FIG. 9 is a view schematically illustrating a process (d) in the manufacturing method for the attachable microphone according to an embodiment of the present disclosure.

FIG. 12 is a graph showing open-circuit sensitivities of attachable microphones manufactured according to embodiments 1 to 3 and of attachable microphones described in reference papers.

FIG. 16 is a graph showing a comparison of a sensitivity per unit area of the attachable microphone manufactured according to an embodiment of the present disclosure, a conventional commercial MEMS microphone, and flexible microphones described in reference papers.

FIG. 17 is a graph showing a comparison of sound pressure and a bandwidth of the attachable microphone manufactured according to an embodiment of the present disclosure, a conventional commercial MEMS microphone, a commercial electret condenser microphone, and flexible sound sensors described in reference papers.

BEST MODE

Hereinafter, embodiments of the present disclosure will be described in detail with reference to the attached drawings so that those skilled in the art can easily implement the present disclosure.

However, the following description is not intended to limit the present disclosure to specific embodiments, and in describing the present disclosure, if it is determined that a detailed description of related known technology may obscure the gist of the present disclosure, the detailed description will be omitted.

Terms used herein are merely used to describe specific embodiments. This is not intended to limit the present disclosure. Singular expressions include plural expressions unless the context clearly dictates otherwise. In this application, terms such as "comprise" or "have" are intended to indicate the presence of features, numbers, steps, operations, components, or a combination thereof described in the specification. Accordingly, the term should be understood as not excluding in advance the presence or addition of one or more other features, numbers, steps, operations, components, or combinations thereof.

Additionally, terms including ordinal numbers, such as first, and second, which will be used below, may be used to describe various components, but the components are not limited by the terms. The terms are used only for the purpose of distinguishing one component from another. For example, a first component may be named a second component, and similarly, the second component may also be named a first component without departing from the scope of the present disclosure.

Additionally, when a component is referred to as being "formed" or "laminated" on another component, it may be formed or laminated by being directly attached to the entire surface or one side of the surface of the other component. However, it should be understood that other components may exist in the middle.

Hereinafter, an attachable microphone and a manufacturing method therefor will be described in detail. However, this is presented as an example, the present disclosure is not limited thereto, and the present disclosure is only defined by the scope of the claims to be described later.

Figure 1:
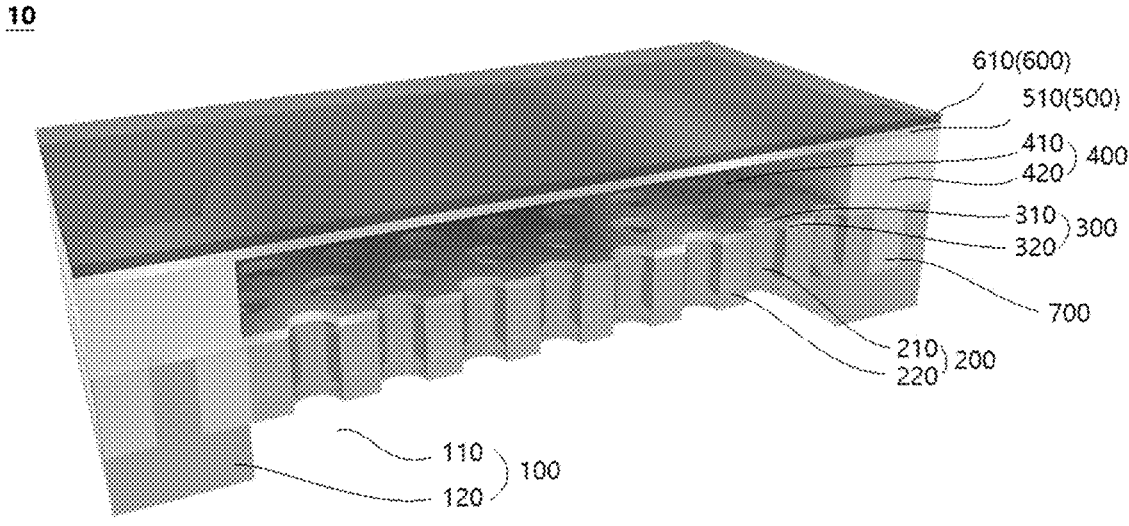
FIG. 1 is a view illustrating a structure of an attachable microphone according to an embodiment of the present disclosure.

FIG. 1 is a view illustrating a structure of an attachable microphone according to an embodiment of the present disclosure.

Referring to FIG. 1, there is provided an attachable microphone 10 including: a substrate 100 including a back chamber 110 having a first cylindrical hollow, the substrate 100 including a first frame member 120 which surrounds the back chamber 110 and which has a first polymer or an inorganic material; a back plate part 200 disposed on the substrate 100, the back plate part 200 including a plurality of first through holes 210 and including a back plate 220 that includes a second polymer; a first electrode part 300 disposed on the back plate part 200, the first electrode part 300 having a plurality of second through holes 310 and including a first electrode member 320; a support part 400 disposed on the first electrode part 300, the support part 400 including a front chamber 410 having a second cylindrical hollow, and the support part 400 including a second frame member 420 which includes a third polymer and which surrounds the front chamber 410; a second electrode part 500 disposed on the support part 400, the second electrode part 500 including a second electrode member 510; and a diaphragm 600 disposed on the second electrode part 500, the diaphragm 600 including a thin film 610 that includes a fourth polymer.

In addition, the attachable microphone may further include an adhesive part 700 including an adhesive agent, the adhesive part 700 may penetrate the back plate part 200 and the first electrode part 300, and the adhesive part 700 may respectively adhere the substrate 100 and the support part 400.

The adhesive agent may include at least one selected from the group consisting of epoxy resin, acrylic resin, novolac resin, formaldehyde resin, polymethyl methacrylate, polystyrene, polyamide, polyimide, polyurea, polyurethane, polydimethylsiloxane, a natural rubber-based adhesive agent, a synthetic rubber-based adhesive agent, a SIS-based adhesive agent, and an acrylic-based adhesive agent, may preferably include epoxy resin, and may more preferably include SU-8.

In addition, the back chamber 110 may include any one shape selected from the group consisting of a cylindrical shape, an elliptical cylindrical shape, a polygonal cylindrical shape, a star-like cylindrical shape, and a combination thereof.

In addition, a size of a diameter of the first cylindrical hollow may be 1 to 1.5 times a size of a diameter of the second cylindrical hollow of the support part.

In addition, a height of the first cylindrical hollow may be 0.01 mm to 1 mm. When the height of the first cylindrical hollow is less than 0.01 mm, sensitivity is low, which is not preferable. Furthermore, when the height of the first cylindrical hollow exceeds 1 mm, flexibility of a device may be impaired, which is not preferable.

In addition, an area of the first cylindrical hollow from an upper part of the first cylindrical hollow to a lower part of the first cylindrical hollow may be the same or may gradually increase.

In addition, the attachable microphone may further include an attachment layer 800 positioned on the substrate 100 in a direction opposite to the back plate part 200, and a thickness of the attachment layer 800 may be 0.01 mm to 1 mm. When the thickness of the attachment layer is less than 0.01 mm, difficulties in attaching the attachment layer occur, which is not preferable. Furthermore, when the thickness exceeds 1 mm, the attachment layer having a thick thickness is formed, so that flexibility of the entire device is reduced, which is not preferable.

In addition, the first polymer may include at least one selected from the group consisting of polyparaxylylene (parylene, poly(p-xylylene)), polyethylene terephthalate, polybutylene terephthalate, polyethylene naphthalate, polyethylene, polypropylene, polystyrene, polycarbonate, polyamide, polyimide, polyurea, polyurethane, polydimethylsiloxane, polystyrene butadiene styrene, polystyrene ethylene butylene styrene, polymethyl methacrylate, acrylonitrile butadiene styrene resin, epoxy resin, acrylic resin, novolac resin, formaldehyde resin, phenolic resin, phenol-formaldehyde resin, polyester resin, bismaleimide triazine resin, polyimide resin, diphenylene ether resin, polycyanate resin, polyolefin resin, and imide-styrene resin. Furthermore, the inorganic material may include at least one selected from the group consisting of silicon, silicon nitride, and silicon oxide.

Preferably, the first frame member 120 may include the first polymer, the first polymer may include epoxy resin, and the first polymer may more preferably include SU-8.

In addition, the second polymer, the third polymer, and the fourth polymer may be the same or different from each other, and may independently include at least one selected from the group consisting of epoxy resin, acrylic resin, novolac resin, formaldehyde resin, polymethyl methacrylate, polyparaxylylene (parylene, poly(p-xylylene)), polyethylene terephthalate, polybutylene terephthalate, polyethylene naphthalate, polyethylene, polypropylene, polystyrene, polycarbonate, polyamide, polyimide, polyurea, polyurethane, polydimethylsiloxane, polystyrene butadiene styrene, polystyrene-acrylate copolymer, polystyrene ethylene butylene styrene, and polyacrylonitrile butadiene styrene, may preferably include epoxy resin, and may more preferably include SU-8.

In addition, in the back plate part 200, a gap between adjacent through holes among the plurality of through holes may be 15 μm to 150 μm, and a diameter of each of the plurality of through holes may be 10 μm to 100 μm.

In addition, a thickness of the back plate part 200 may be 10 μm to 500 μm. When the thickness of the back plate part is less than 10 μm, the back plate part may be deflected such as a diaphragm by sound pressure, which is not preferable. Furthermore, when the thickness of the back plate part exceeds 500 μm, a high frequency sound signal may be difficult to be sensed due to viscosity between air and the back plate part, which is not preferable.

In addition, a thickness of the support part 400 may be 0.1 μm to 20 μm, and may preferably be 1 μm to 10 μm. When the thickness of the support part is less than 0.1 μm, a distance between the diaphragm and the back plate is close. Therefore, when the diaphragm is deflected by sound pressure, a size change in capacitance increases, so that sound sensing sensitivity of a microphone increases. However, when the diaphragm is deflected, the diaphragm and the back plate may be in contact with each other, and stability may be reduced, which is not preferable. Furthermore, when the thickness of the support part exceeds 20 μm, the size change in capacitance is reduced, and the sensitivity of the microphone is reduced, which is not preferable.

In addition, a thickness of the diaphragm 600 may be 0.1 μm to 10 μm, may preferably be 0.3 μm to 3 μm, and may more preferably be 0.6 μm to 1.2 μm. When the thickness of the diaphragm is less than 0.1 μm, deflection of the diaphragm due to sound pressure increases, and as a result, the sound sensing sensitivity of the device increases. However, a stability problem in which the formed diaphragm is destroyed or the formed diaphragm sticks to the back plate may occur, which is not preferable. Furthermore, when the thickness of the diaphragm exceeds 10 μm, the deflection phenomenon caused by sound pressure is reduced, so that the sensitivity is reduced, which is not preferable.

In addition, the Young's modulus of the back plate 220 may be at least 100 MPa, the Young's modulus of the thin film 610 may be 1 MPa to 10 GPa, and a loss tangent tan δ may be equal to or less than 0.03.

When the Young's modulus of the back plate 220 is less than 100 Mpa, the back plate part is deflected such as the diaphragm by sound pressure, so that the sensitivity of the microphone is reduced, which is not preferable.

When the Young's modulus of the thin film 610 is less than 1 Mpa, a high tendency of a mechanical attenuation (loss tangent, tan δ) may be exhibited, so that the thin film 610 does not have a constant diaphragm deflection for a wide frequency range, which is not preferable. Furthermore, when the Young's modulus of the thin film 610 exceeds 10 Gpa, the deflection phenomenon caused by sound pressure is reduced, so that the sensitivity is reduced, which is not preferable.

In addition, the plurality of first through holes 210 of the back plate part 200 may be in contact with the plurality of second through holes 310 of the first electrode part 300, a height direction of the first through holes 210 may be perpendicular to a surface of the first electrode part 300, and the second cylindrical hollow of the front chamber 410 may be in contact with the second electrode part 500, and a height direction of the second cylindrical hollow may be perpendicular to the surface of the first electrode part 300 and to a surface of the second electrode part 500.

In addition, a diameter of the second cylindrical hollow may be 50 μm to 3,000 μm, and may preferably be 500 μm to 2,000 μm. When the diameter of the second cylindrical hollow is less than 50 μm, an area of the deflected diaphragm is small, so that sound sensing performance of the microphone is reduced, which is not preferable. Furthermore, when the diameter of the second cylindrical hollow exceeds 3,000 μm, sound pressure is strongly transmitted to a specific point in the diaphragm according to a length of a waveform in the audible frequency range (20 Hz to 20,000 Hz), so that the degree of deflection of the diaphragm becomes irregular, which is not preferable.

In addition, the first electrode member and the second electrode member may be the same or different from each other, and may independently include at least one selected from the group consisting of gold, titanium, platinum, nickel, palladium, copper, zinc, cadmium, iron, cobalt, iridium, tin, gallium, aluminum, manganese, chromium, molybdenum, tungsten, graphene, carbon nanotube, graphite, indium tin oxide, and PEPOT:PSS.

In addition, the attachable microphone may have a horizontal length of 1.4 mm to 10 mm, a vertical length of 1.4 mm to 10 mm, and a thickness of 50 μm to 5 mm.

Back Chamber 110

The back chamber is positioned below the diaphragm 600 and the back plate part 200, and provides a space for air in the front chamber 410 to escape so that the diaphragm is more easily moved by sound pressure.

It is preferable that the back chamber is larger than the diaphragm (=the cylindrical hollow of the support part). However, when the back chamber is too large, the diaphragm and the back plate may simultaneously move, so that a decrease in sensitivity of the microphone may occur. That is, it is preferable that the back chamber has a size including a size of the diaphragm (=the cylindrical hollow of the support part) and has a size 1 to 1.5 times the size of the cylindrical hollow of the support part.

In addition, a side surface of the back chamber may have a vertical shape or a diagonal shape, an area of a lower part of the back chamber may be different from an area of an upper part of the back chamber, and it is preferable that the area of the lower part of the back chamber is equal to or larger than the area of the upper part of the back chamber.

First Frame Member 120

The first frame member may be a single non-adhesive layer, a single adhesive layer, or a double layer in which a non-adhesive layer is provided on an adhesive layer.

When the first frame member is the double layer, only the non-adhesive layer may have the back chamber, and the adhesive layer may have a flat plate structure in which the back chamber is not provided. At this time, a thickness of the adhesive layer may be 0.01 mm to 1 mm.

In a situation in which the first frame member is the single non-adhesive layer, when first frame member has a thin thickness of about 10 μm to 50 μm, the first frame member may be attached on a surface without the adhesive layer.

Back Plate Part 200

The back plate part is manufactured such that the back plate part is disposed parallel to the diaphragm, and generates a capacitance. In addition, the back plate part has a plurality of through holes so that influence of air between the diaphragm and the back plate part is minimized when the diaphragm is vibrated.

The plurality of through holes of the back plate part may be in contact with the diaphragm, and a longitudinal direction of the through holes may be perpendicular to a surface direction of the first electrode part.

The thickness of the back plate part may be 10 μm to 500 μm. When the thickness of the back plate part is less than 10 μm, the back plate part may be deflected such as a diaphragm by sound pressure, which is not preferable. Furthermore, when the thickness of the back plate part exceeds 500 μm, a high frequency sound signal may be difficult to be sensed due to viscosity between air and the back plate part, which is not preferable.

Support Part 400

The second cylindrical hollow of the front chamber 410 of the support part may be in contact with the diaphragm 600, and a longitudinal direction of the second cylindrical hollow may be perpendicular to the surface direction of the first electrode part.

The second cylindrical hollow may be in contact with the diaphragm, and the diaphragm may be disposed parallel to a surface of the first electrode part.

The diameter of the second cylindrical hollow may be 50 μm to 3000 μm.

The second cylindrical hollow may include any one shape selected from the group consisting of a cylindrical shape, an elliptical cylindrical shape, a polygonal cylindrical shape, and a star-like cylindrical shape.

Figure 7:
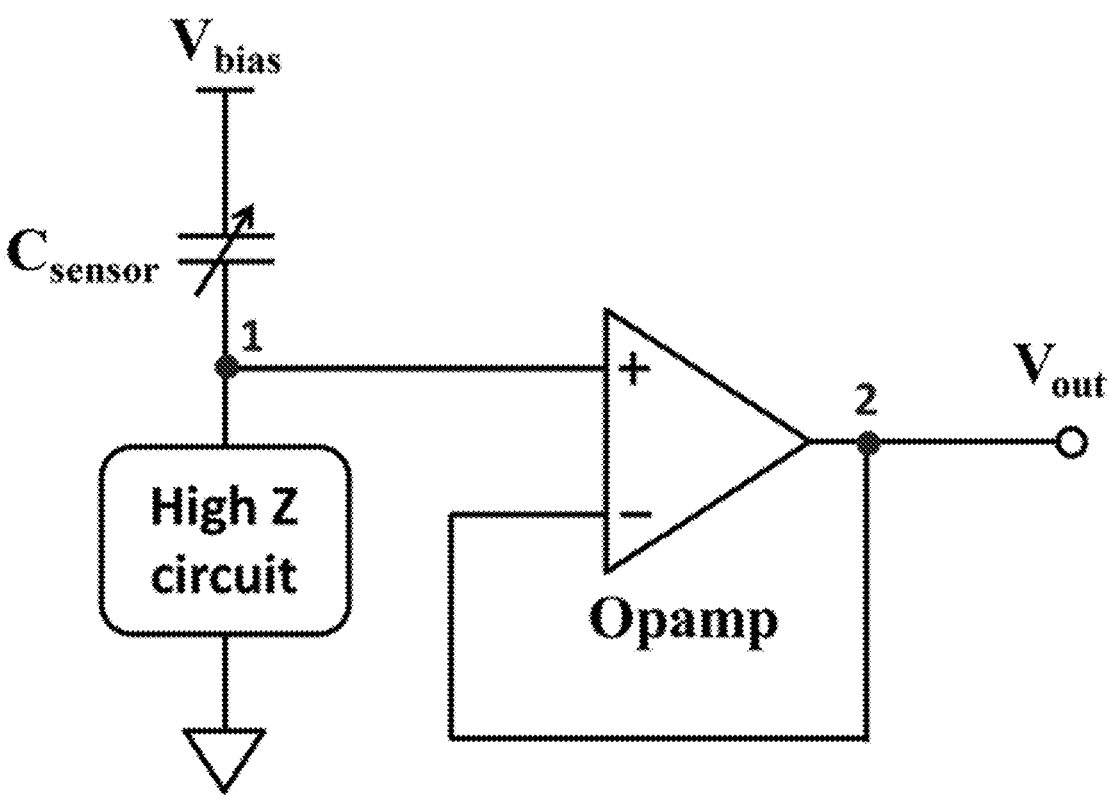
FIG. 7 is a view schematically illustrating a circuit diagram and an operation principle of the attachable microphone according to an embodiment of the present disclosure.

FIG. 7 is a view schematically illustrating a circuit diagram and an operation principle of the attachable microphone according to an embodiment of the present disclosure.

The diaphragm is moved dynamically by sound pressure transmitted through air. That is, the diaphragm is moved dynamically by sound. At this time, the capacitance is changed by a change in a distance between the first electrode part and the second electrode part. When the microphone is connected to a sufficiently large impedance as illustrated in the circuit diagram, unlike the capacitance that is rapidly changed according to a sound frequency, an RC delay time formed by the microphone and a large impedance circuit is required for a stored charge to be moved, so that the amount of charge stored in the microphone is maintained at a constant rate. The amount of charge is constant, but the distance between the two electrodes is changed, so that a voltage between the two electrodes is changed in proportion to the distance to the distance, which is output to an outside by an impedance conversion through the circuit.

In the attachable microphone of the present disclosure, a wide (1600 μm wide) and very thin (800 nm thick) organic diaphragm is placed on a 4 μm thin circular pattern of holes. The larger the area of the diaphragm or the smaller the residual stress, the more likely the diaphragm to be moved due to the same external force is.

The present disclosure provides a microphone array including a plurality of attachable microphones.

Figure 8:
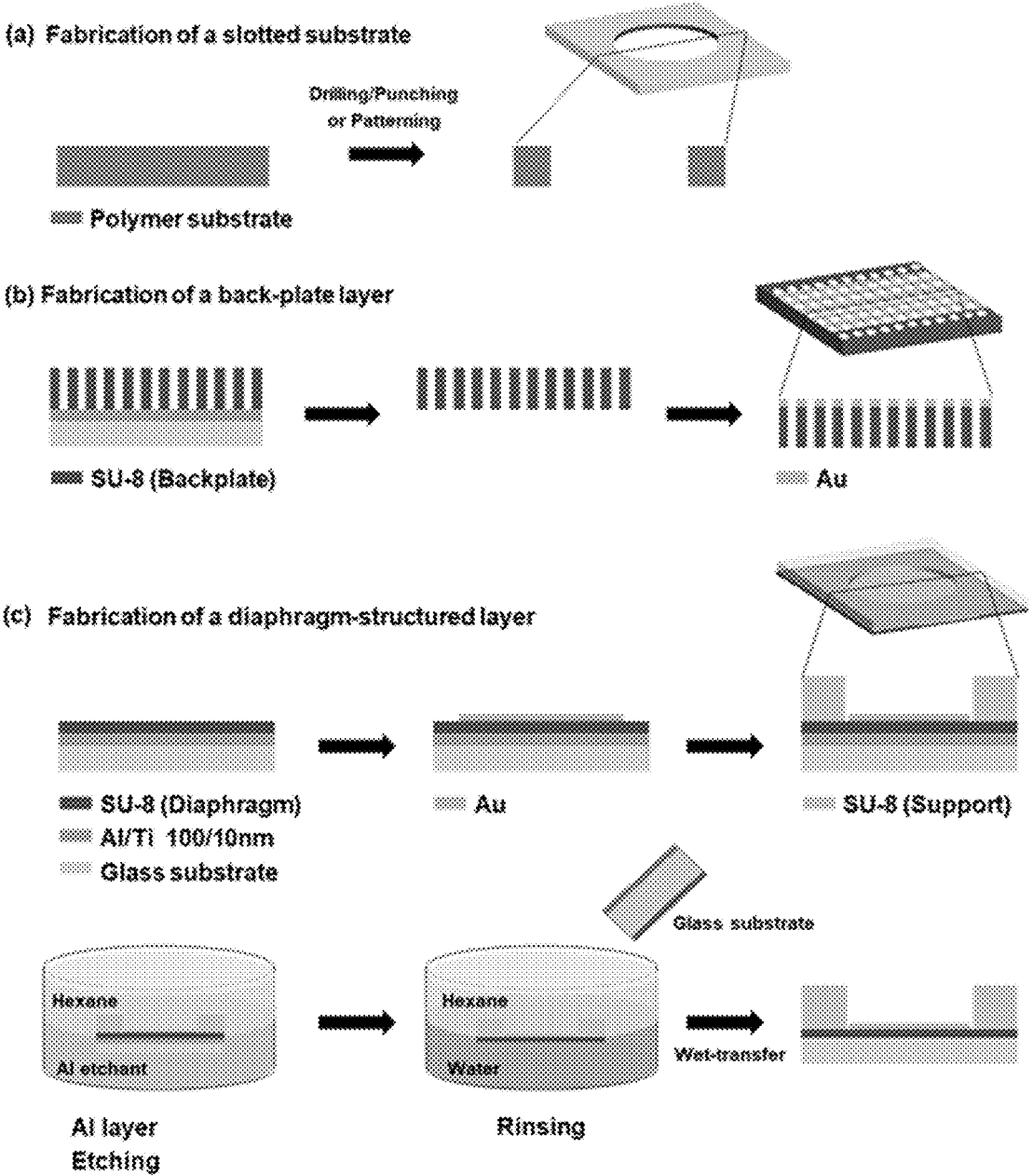
FIG. 8 is a view schematically illustrating processes (a), (b), and (c) in a manufacturing method for an attachable microphone according to an embodiment of the present disclosure.

FIG. 8 is a schematic view illustrating processes (a), (b), and (c) in a manufacturing method for an attachable microphone according to an embodiment of the present disclosure, and FIG. 9 is a schematic view illustrating a process (d) in the manufacturing method for the attachable microphone according to an embodiment of the present disclosure.

Referring to FIG. 8 and FIG. 9, in the present disclosure, there is provided a manufacturing method for an attachable microphone, the manufacturing method including: (a) a process of fabricating the substrate 100 which includes the back chamber 110 having the first cylindrical hollow and which includes the first frame member 120 surrounding the back chamber 110 and including the first polymer; (b) a process of fabricating a lower plate including the back plate part 200 and the first electrode part 300, the back plate part 200 including the plurality of first through holes 210 and the back plate 220 that includes the second polymer, the first electrode part 300 being disposed on the back plate part 200 and including the plurality of second through holes 310 and the first electrode member 320; (c) a process of fabricating an upper plate including the support part 400, the second electrode part 500, and the diaphragm 600, the support part 400 including the front chamber 410 that has the second cylindrical hollow and including the second frame member 420 which includes the third polymer and which surrounds the front chamber 410, the second electrode part 500 being disposed on the support part 400 and including the second electrode member 510, the diaphragm 600 being disposed on the second electrode part 500 and including the thin film 610 that includes the fourth polymer; and (d) a process of fabricating the attachable microphone having a substrate/ lower plate/upper plate structure by using thin film transferring.

In addition, the process (d) may be a process of forming the substrate/lower plate/upper plate structure by using thin film transferring and of fabricating the attachable microphone by forming the adhesive part 700 that includes the adhesive agent. Furthermore, the adhesive part 700 may penetrate the back plate part 200 and the first electrode part 300, and the adhesive part 700 may respectively adhere the substrate 100 and the support part 400.

In addition, the process (b) may include: (b-1) a process in which a sacrificial layer is formed on a base, and the back plate part 200 having the plurality of first through holes 210 and having the back plate 220 that includes the second polymer is formed on the sacrificial layer, thereby forming a base/sacrificial layer/back plate part structure; (b-2) a process of forming a single back plate part 200 by etching the sacrificial layer of the base/sacrificial layer/back plate part structure; and (b-3) a process in which the first electrode part 300 having the plurality of second through holes 310 and the first electrode member 320 is formed on the back plate part 200, thereby forming the lower plate having the back plate part 200 and the first electrode part 300.

After the (b-1) process, the process (b) may further include (b-1-1) a process of crosslinking the back plate 200 by performing hard baking. This process is performed so as to maximize stiffness by completely crosslinking epoxy resin (SU-8) that is used as the back plate, so that the back plate is not deformed by sound pressure unlike the diaphragm.

In addition, the process (c) may include: (c-1) a process in which the sacrificial layer is formed on the base, and the diaphragm 600 having the thin film 610 that has the fourth polymer is formed on the sacrificial layer, thereby forming a base/sacrificial layer/diaphragm structure; (c-2) a process in which the second electrode part 500 having the second electrode member 510 is formed on the diaphragm of the base/sacrificial layer/diaphragm structure, thereby forming a base/sacrificial layer/diaphragm/second electrode part structure; (c-3) a process in which the support part 400 having the front chamber 410 that has the second cylindrical hollow and having the second frame member 420 which has the third polymer and which surrounds the front chamber 410 is formed on the second electrode part 500, thereby forming a base/sacrificial layer/diaphragm/second electrode part/support part structure; and (c-4) a process of fabricating the upper plate including a diaphragm/second electrode part/ support part structure by etching the sacrificial layer of the base/sacrificial layer/diaphragm/second electrode part/support part structure.

After the (c-1) process, the process (c) may further include a process of crosslinking the thin film 610 by performing hard baking. This process is performed so as to form the diaphragm by crosslinking epoxy resin (SU-8) that is used as the thin film, so that stiffness of the diaphragm may be adjusted according to the degree of crosslinking.

In addition, the process (d) may include: (1) a process in which the base is disposed on the diaphragm 600 in a direction opposite to the second electrode part 500, thereby forming a base/diaphragm 600/second electrode part 500/ support part 400 structure; (2) a process in which the first electrode part 300 of the lower plate is disposed on the support part 400 of the base/diaphragm 600/second electrode part 500/support part 400 structure, thereby forming a base/upper plate/lower plate structure; (3) a process in which an upper plate/lower plate structure is separated from the base/upper plate/lower plate structure; and (4) a process in which the back plate part 200 of the upper plate/lower plate structure is disposed on the substrate 100, thereby fabricating the attachable microphone having the substrate/lower plate/upper plate structure.

In addition, the process (d) may include: (1') a process in which the back plate part 200 of the lower plate is disposed on the substrate 100, thereby forming a substrate/lower plate structure; and (2') a process in which the support part 400 of the upper plate is disposed on the first electrode part 300 of the substrate/lower plate structure, thereby fabricating the attachable microphone having the substrate/lower plate/ upper plate structure.

In addition, the process (d) may include: (1") a process in which the base is disposed on the diaphragm 600 of the upper plate in a direction opposite to the second electrode part 500, thereby forming the base/diaphragm 600/second electrode part 500/support part 400 structure; (2") a process in which the first electrode part 300 of the lower plate is disposed on the support part 400 of the base/diaphragm 600/second electrode part 500/support part 400 structure, thereby forming the base/upper plate/lower plate structure; (3") a process in which the substrate 100 is disposed on the lower plate of the base/upper plate/lower plate structure, thereby forming a base/upper plate/lower plate/substrate structure; and (4") a process in which an upper plate/lower plate/substrate structure is separated from the base/upper plate/lower plate/substrate structure, thereby fabricating the attachable microphone having the substrate/lower plate/ upper plate structure.

In addition, after the process (d), the manufacturing method for the attachable microphone may further include (e) a process of forming the attachment layer 800 on the substrate in a direction opposite to the back plate part.

MODE FOR INVENTION

Hereinafter, the present disclosure will be described in more detail through embodiments. However, the embodiments are for illustrative purposes, and the scope of the present disclosure is not limited thereto.

Embodiment

Attachable Microphone Manufacturing

Embodiment 1

FIG. 1 is a view illustrating a structure of an attachable microphone according to an embodiment of the present disclosure, FIG. 8 is a schematic view illustrating processes (a), (b), and (c) in a manufacturing method for an attachable microphone according to an embodiment of the present disclosure, and FIG. 9 is a schematic view illustrating a process (d) in the manufacturing method for the attachable microphone according to an embodiment of the present disclosure. An attachable microphone was manufactured with reference to FIG. 1, FIG. 8, and FIG. 9.

Substrate Manufacturing

A 400 μm thick PCB substrate having a circular through hole that has a diameter of 2500 μm was used. Alternatively, a substrate having the same structure was manufactured by patterning SU-8 (any one of SU-8/SU-8 2000/SU-8 3000 series of Kayaku Co. or Microchem Co., and all SU-8 described in the following embodiments are the same product) that is a negative PR and then by performing a hard baking for 30 minutes at 95 degrees Celsius. The entire area of a device substrate is 9 mm² (3 mm*3 mm).

Lower Plate Manufacturing

After Ti/Al (10/100 nm) that will serve as a sacrificial layer was deposited on a glass substrate, a back plate in which a plurality of through holes is patterned by using SU-8 (13 μm) that is the negative PR was generated, and hard baking was performed at 95 degrees Celsius for 30 minutes. At this time, a diameter of the through holes is 35 μm, a distance between centers of the through holes is 50 μm, and the through holes are hexagonally arranged. In addition, the entire area of a lower plate is 9 mm² (3 mm*3 mm). Then, aluminum used as the sacrificial layer is removed by using an etching solution, and the etching solution is wiped clean through a rinsing process, and then the etching solution is dried. Then, sputtering was performed by patterning Au by using a stencil deposition mask, and a first electrode part was formed.

Upper Plate Manufacturing

After Ti/Al (10/100 nm) that will serve as a sacrificial layer was deposited on a glass substrate, hard baking was performed at 95 degrees Celsius for 30 minutes by using SU-8 (800 μm) that is the negative PR and then a diaphragm was formed. Then, Au was patterned by using a positive PR, and an electrode pattern was deposited. Then, patterning was performed by using SU-8 once more, and a support part (4 μm) including a cylindrical hollow was manufactured, thereby manufacturing an upper plate. At this time, a diameter of the cylindrical hollow is 1,600 μm, and the entire area of the upper plate is 9 mm² (3 mm*3 mm). In the upper plate, aluminum used as the sacrificial layer is removed by using an etching solution, and the etching solution is wiped clean through a rinsing process. At this time, the diaphragm in the upper plate is easily mechanically damaged. Therefore, in order to prevent the diaphragm from being mechanically damaged, IPA was mixed with an Al etchant that is a water base, and an etching solution topped with Hexane was used so as to remove aluminum. Then, in order to perform lower plate transferring, the upper plate is transferred to a flat glass substrate and then dried first.

Device Manufacturing by Using Thin Film Transferring

An attachable microphone was manufactured through thin film transferring on the basis of [Transferring method 1] illustrated in FIG. 9.

Specifically, transferring is performed such that the first electrode part of the lower plate (lower plate part/first electrode part) faces downward on the support part of the upper plate (glass substrate/diaphragm/second electrode part/support part) that is transferred to the glass substrate. After transferring, an adhesive part including SU-8 is formed through the plurality of through holes of the lower plate disposed on the second frame member of the support part, and the upper plate and the lower plate are chemically coupled by the adhesive part by being exposed to UV.

Then, after SU-8 is applied on the device substrate, the upper plate/lower plate stacked structure is separated from the glass substrate disposed below the upper plate, and then the lower plate is disposed such that the back plate part of the lower plate is placed on the substrate. At this time, SU-8 applied on the device substrate enters the plurality of through holes of the lower plate and forms the adhesive part including SU-8. Then, the upper plate/lower plate stacked structure is coupled to the substrate by being exposed to UV.

Finally, the attachable microphone having an entire area of 9 mm² (3 mm*3 mm) was manufactured after the attachable microphone is coupled by attaching a 50 μm thick double-sided adhesive layer (attachment layer) to the substrate in a direction opposite to the lower plate.

FIG. 7 is a view schematically illustrating a circuit diagram and an operation principle of the attachable microphone according to an embodiment of the present disclosure. Referring to FIG. 7, the first electrode of the microphone is connected to a bias voltage maintaining device, and the second electrode is grounded through a large impedance circuit. A voltage generated from a node 1 (see FIG. 7) by sound pressure is changed from a large impedance to a small impedance through a voltage follower using an amplifier. Finally, a voltage output at a node 2 (see FIG. 7) has a voltage of the same size and the same phase as the node 1, but an output impedance is output in a very low state.

In the case of a large impedance circuit, a high resistance may be used, and all circuits having high resistance, such as a back-to-back diode or a pseudo-MOS structure using a pMOS, are included. Since a low cutoff frequency of the microphone is determined by an RC constant according to the resistance of the large impedance circuit and the capacitance of the microphone, a circuit having a sufficiently large resistance is required to be applied. For example, in a situation in which the microphone has 1 pF, a low cutoff is formed at 32 Hz when the large impedance is 5 gigaohms (GΩ), which means that the microphone operates at at least 32 Hz.

Embodiment 2

The attachable microphone was manufactured in the same manner as Embodiment 1 except that a process of performing hard baking at 150 degrees Celsius for 30 minutes was performed instead of performing hard baking at 95 degrees Celsius for 30 minutes.

Embodiment 3

The attachable microphone was manufactured in the same manner as Embodiment 1 except that a process of performing hard baking at 240 degrees Celsius for 30 minutes was performed instead of performing hard baking at 95 degrees Celsius for 30 minutes.

Embodiment 4

The attachable microphone was manufactured in the same manner as Embodiment 1 except that a process of performing hard baking at 240 degrees Celsius for 30 minutes was performed instead of performing hard baking at 95 degrees Celsius for 30 minutes, and except that the diameter of the cylindrical hollow of the support was 1,200 μm instead of 1,600 μm.

Embodiment 5

The attachable microphone was manufactured in the same manner as Embodiment 1 except that a process of performing hard baking at 240 degrees Celsius for 30 minutes was performed instead of performing hard baking at 95 degrees Celsius for 30 minutes, and except that the diameter of the cylindrical hollow of the support was 800 μm instead of 1,600 μm.

Embodiment 6

The attachable microphone was manufactured in the same manner as Embodiment 1 except that thin film transferring is performed on the basis of [Transferring method 2] instead of performing thin film transferring on the basis of [Transferring method 1] illustrated in FIG. 9.

Specifically, the back plate part of the lower plate (back plate part/first electrode part) faces downward and is transferred on the substrate. After transferring, the adhesive part is formed through the plurality of through holes of the lower plate disposed on the first frame member of the substrate, and the substrate and the lower plate are chemically coupled by the adhesive part by being exposed to UV.

Then, a part of the support part of the upper plate (diaphragm/second electrode part/support part) faces downward and is transferred on the first electrode part of the lower plate. At this time, the adhesive part is formed on the second electrode part that is in contact with the second frame member of the support part, and the substrate/lower plate stacked structure is coupled to the upper plate by being exposed to UV.

Finally, the attachable microphone having an entire area of 9 mm² (3 mm*3 mm) was manufactured after the attachable microphone is coupled by attaching a 50 μm thick double-sided adhesive layer (attachment layer) to the substrate in a direction opposite to the lower plate.

Embodiment 7

The attachable microphone was manufactured in the same manner as Embodiment 1 except that thin film transferring is performed on the basis of [Transferring method 3] instead of performing thin film transferring on the basis of [Transferring method 1] illustrated in FIG. 9.

Specifically, transferring is performed such that the first electrode part of the lower plate (lower plate part/first electrode part) faces downward on the support part of the upper plate (glass substrate/diaphragm/second electrode part/support part) that is transferred to the glass substrate. After transferring, the adhesive part is formed through the plurality of through holes of the lower plate disposed on the second frame member of the support part, and the upper plate and the lower plate are chemically coupled by the adhesive part by being exposed to UV.

Then, the substrate was formed on the back plate part of the lower plate and then is exposed to UV, thereby fabricating a glass substrate/upper plate/lower plate/substrate stacked structure.

Then, the upper plate/lower plate/substrate structure is separated from the glass substrate disposed below the upper plate, and the attachable microphone having an entire area of 9 mm² (3 mm*3 mm) was manufactured after the attachable microphone is coupled by attaching a 50 μm thick double-sided adhesive layer (attachment layer) to the substrate in a direction opposite to the lower plate.

Test Example

Test Example 1: Checking of Microphone Manufacturing

Figure 2:
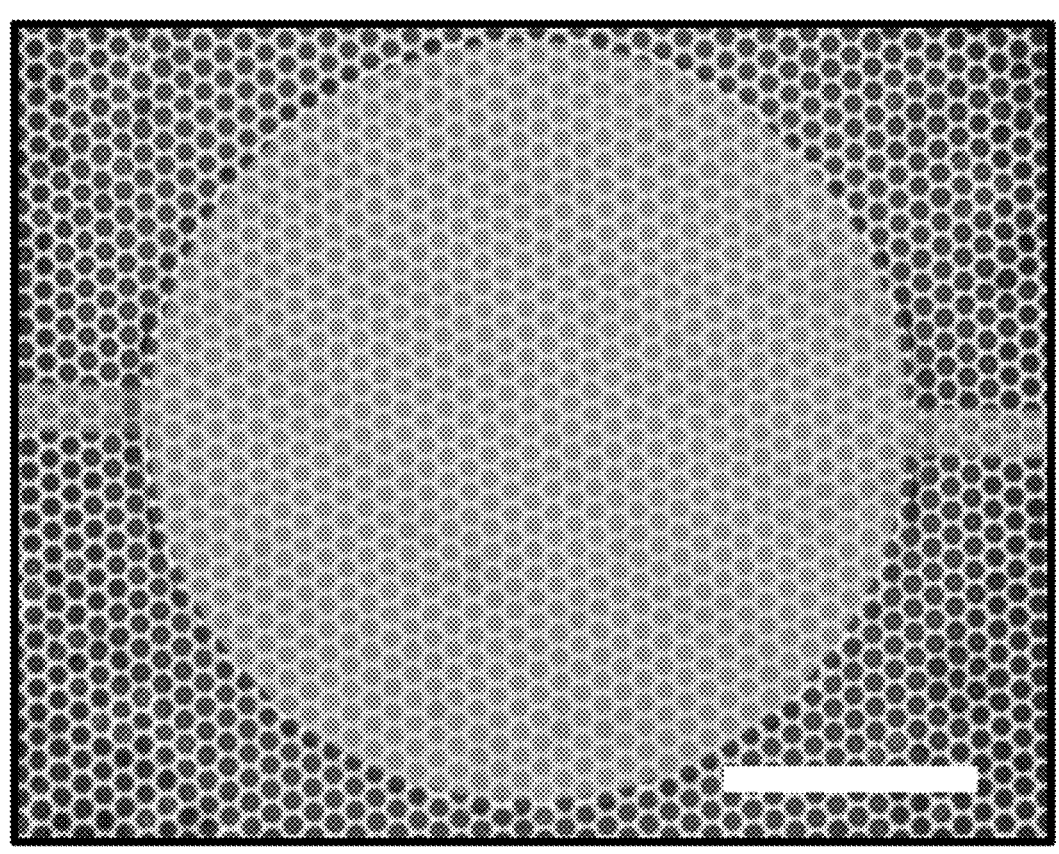
FIG. 2 is a top-viewed image of the microphone manufactured according to embodiment 1, the microphone being viewed from above with an optical microscope. (Scale bar: 500 μm)

FIG. 2 is a top-viewed image of the microphone manufactured according to embodiment 1, the microphone being viewed from above with an optical microscope. (Scale bar: 500 μm)

Referring to FIG. 2, the thin film has a thickness of about 800 nm, and the second electrode part has a thickness of about 100 nm, so that the microphone manufactured according to embodiment 1 is very thin. Therefore, in the microphone manufactured according to embodiment 1, the back plate part is capable of being observed without removing the diaphragm/second electrode structure.

Figure 3A:
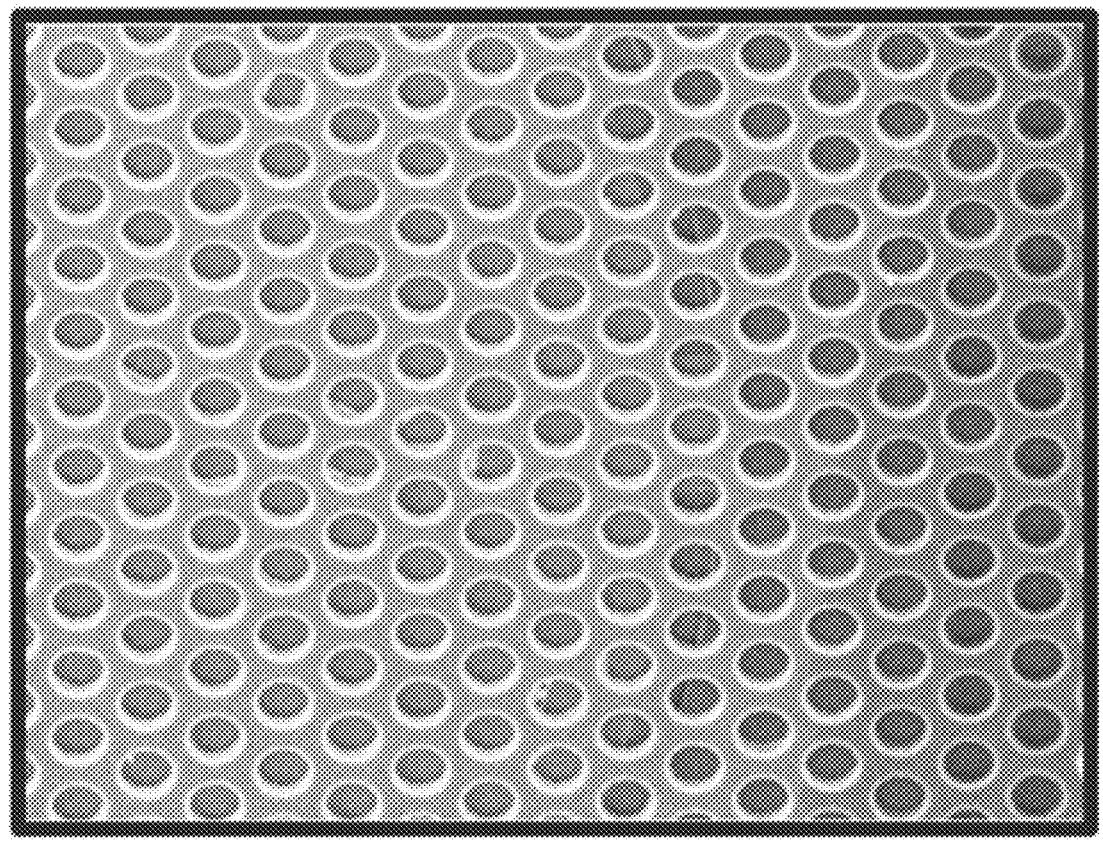
FIG. 3a is an image secured by observing a part of the microphone manufactured according to embodiment 1, the part excluding a substrate and being viewed from below with an electron microscope.
Figure 3B:
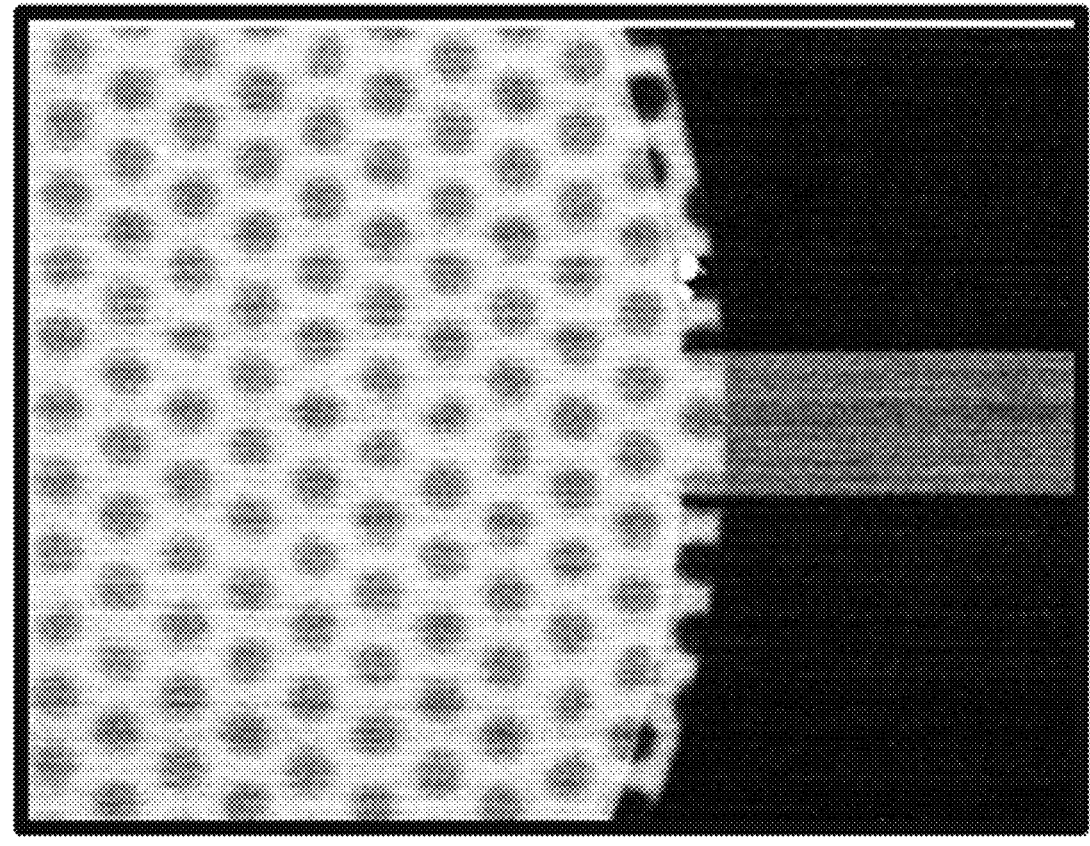
FIG. 3b is an image secured by observing a part of the microphone manufactured according to embodiment 1, the part excluding the substrate and being viewed from above with the electron microscope.

FIG. 3*a* is an image secured by observing the back plate part, the first electrode part, the support part, the second electrode part, and the diaphragm of the microphone manufactured according to embodiment 1 from below by using an electron microscope, excluding the substrate. FIG. 3*b* is an image secured by observing the back plate part, the first electrode part, the support part, the second electrode part, and the diaphragm of the microphone manufactured according to embodiment 1 from above by using the electron microscope, excluding the substrate.

Figure 3C:
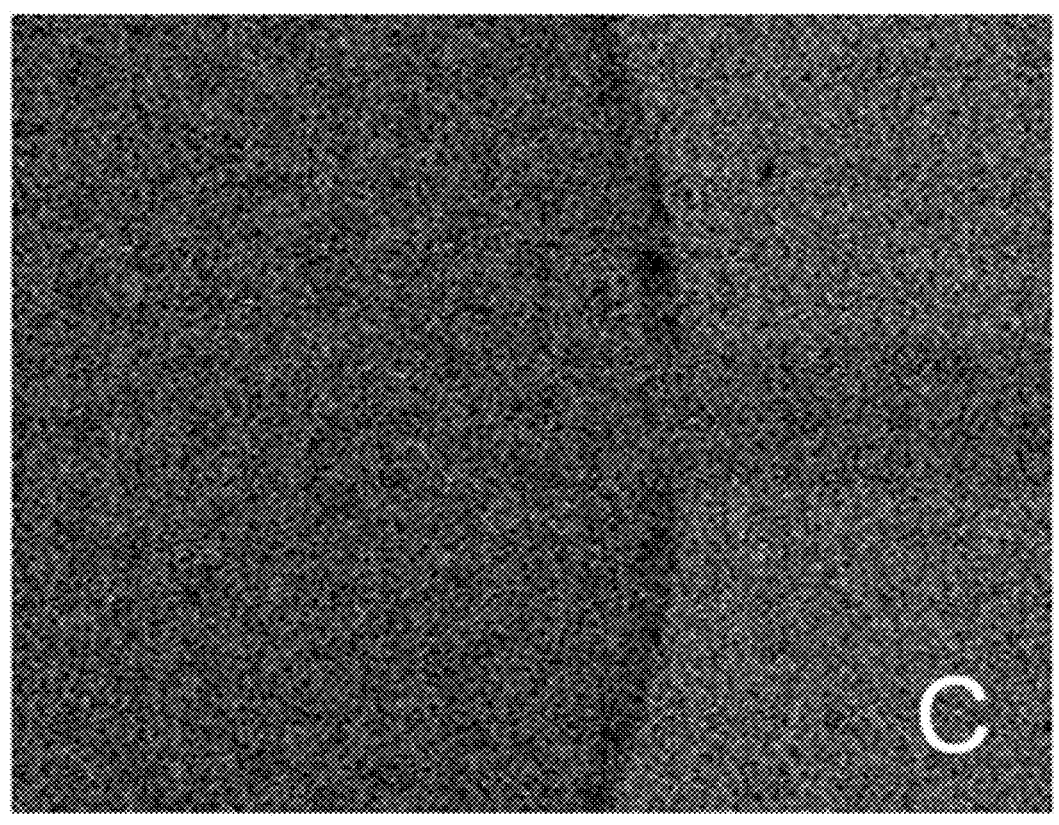
FIG. 3c is an image illustrating a distribution of carbon in the microphone when a part of the microphone manufactured according to embodiment 1 excluding the substrate is viewed from above with the electron microscope.
Figure 3D:
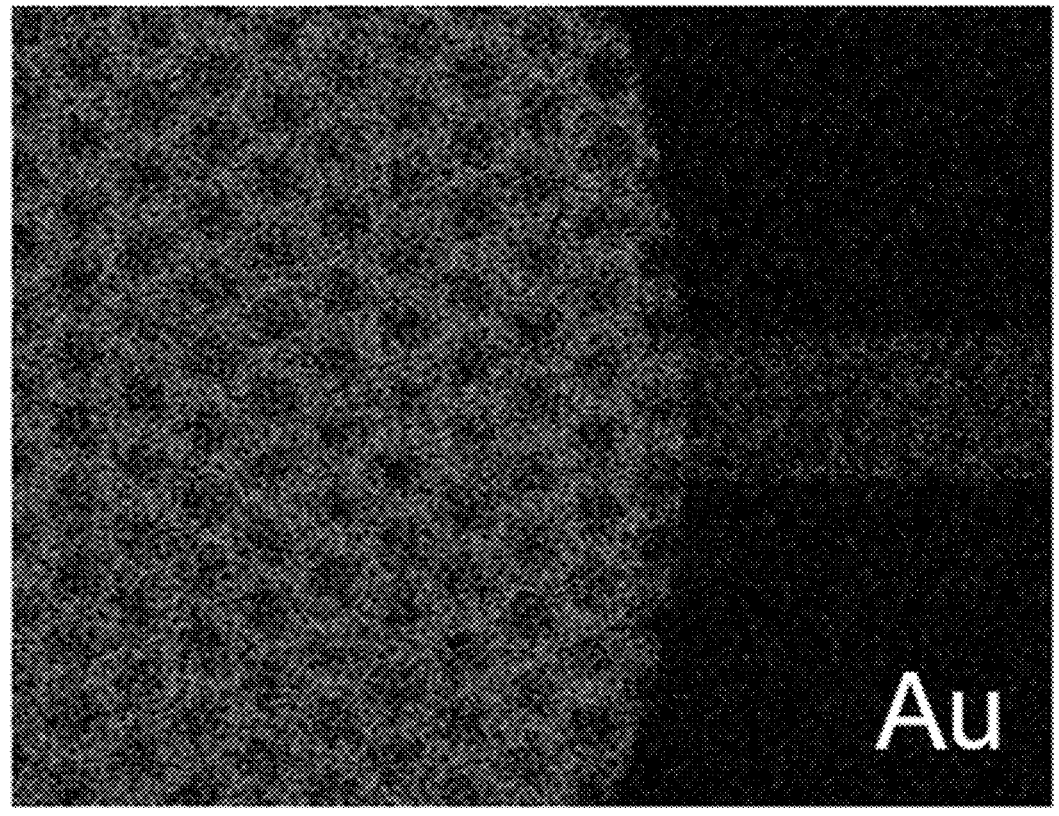
FIG. 3d is an image illustrating a distribution of gold in the microphone when a part of the microphone manufactured according to embodiment 1 excluding the substrate is viewed from above with the electron microscope.

FIG. 3*c* is an image of a carbon distribution in the microphone manufactured according to embodiment 1 by mapping energy component X-ray spectroscopy when the back plate part, the first electrode part, the support part, the second electrode part, and the diaphragm excluding the substrate are observed from above by using the electron microscope. FIG. 3*d* is an image of a gold distribution in the microphone manufactured according to embodiment 1 by mapping energy component X-ray spectroscopy when the back plate part, the first electrode part, the support part, the second electrode part, and the diaphragm excluding the substrate are observed from above by using the electron microscope.

Referring to FIGS. 3*a* to 3*d*, it can be seen that the structure of the microphone is formed of an organic material, that the second electrode part is limited to the size of the cylindrical hollow of the support part, and that the structure is minimized for electrode coupling. By limiting the area of the second electrode part, an initial capacitance value may be reduced, thereby being capable increasing a sound sensing performance of the microphone.

Figure 4:
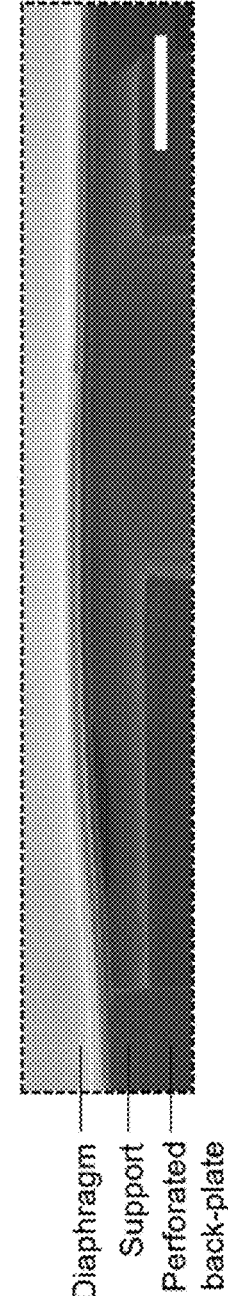
FIG. 4 is an image illustrating a cross-sectional view of the microphone manufactured according to embodiment 1, the microphone being observed with the electron microscope. (Scale bar: 10 μm)

FIG. 4 is an image illustrating a cross-sectional view of the microphone manufactured according to embodiment 1, the microphone being observed with the electron microscope. (Scale bar: 10 μm)

Referring to FIG. 4, it can be seen that the microphone manufactured according to embodiment 1 includes the thin film having a thickness of about 800 nm, the second electrode part having a thickness of about 100 nm, and the back plate part having hexagonally arranged through holes with a diameter of 35 μm and a distance between the centers of 50 μm.

Figure 5A:
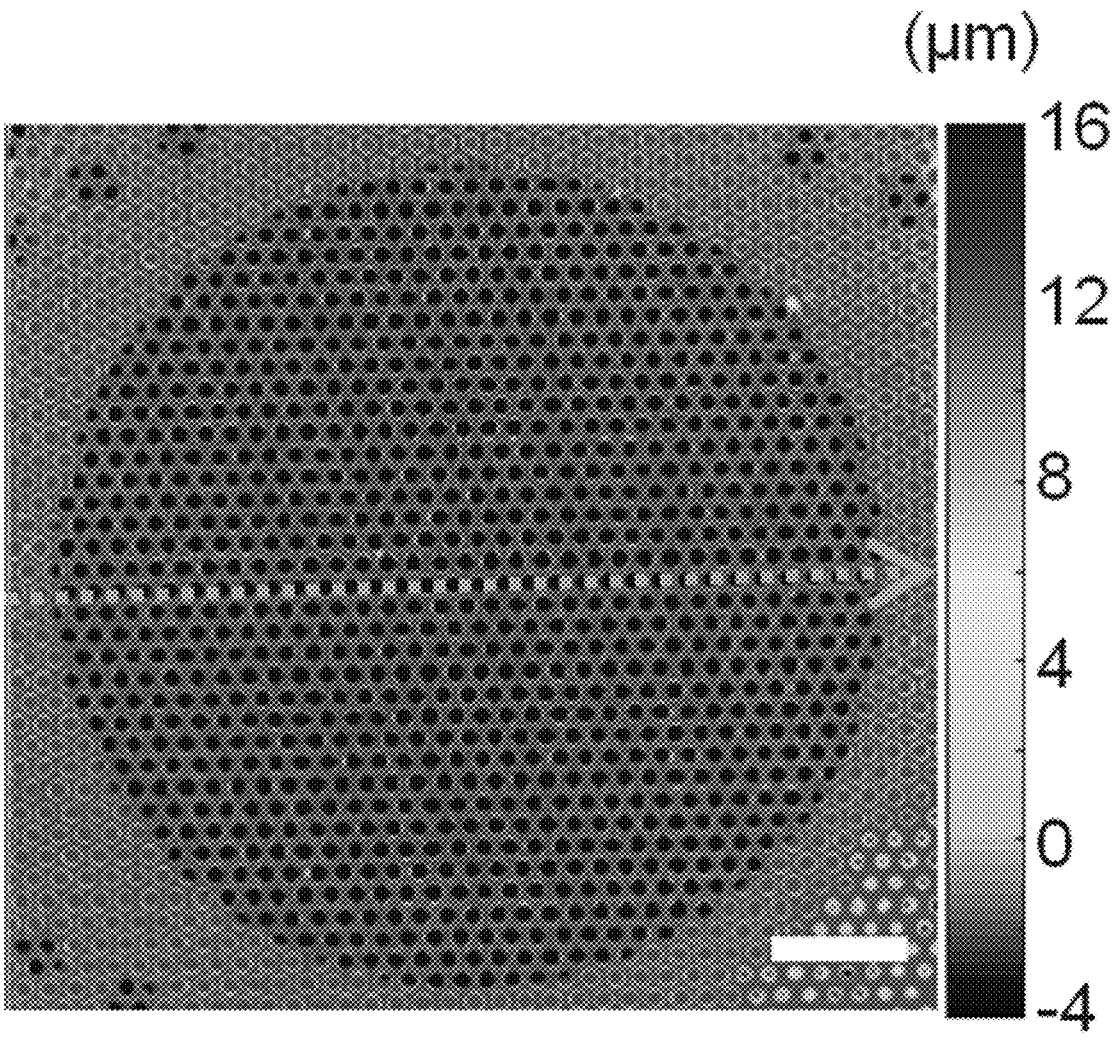
FIG. 5a is an image of a step in a Z-axis direction of the microphone manufactured according to embodiment 1, the step being observed in a non-contact manner.
Figure 5B:
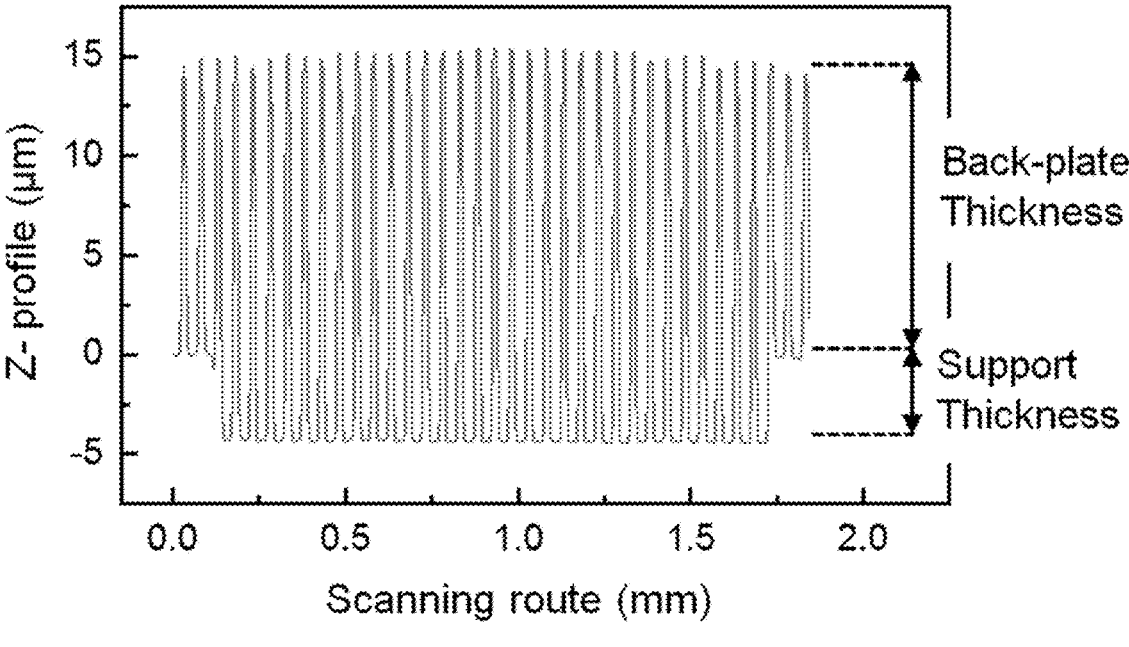

FIG. 5*a* is an image of a step in a Z-axis direction of the microphone manufactured according to embodiment 1, the step being observed in a non-contact manner. FIG. 5*b* is a graph based on the image in FIG. 5*a*.

Referring to FIG. 5*a* and FIG. 5*b*, it can be seen that the graph shows a repetitive shape up and down by several through holes in the back plate part, and the thickness of the support part and the back plate part/second electrode part structure may be checked.

Figure 6:
FIG. 6 is an image of an overall appearance of the microphone manufactured according to embodiment 1.

FIG. 6 is an image of an overall appearance of the microphone manufactured according to embodiment 1.

Referring to FIG. 6, the microphone manufactured according to the present disclosure may be manufactured in an ultra-small size of 4 mm² to 9 mm².

Figure 10:
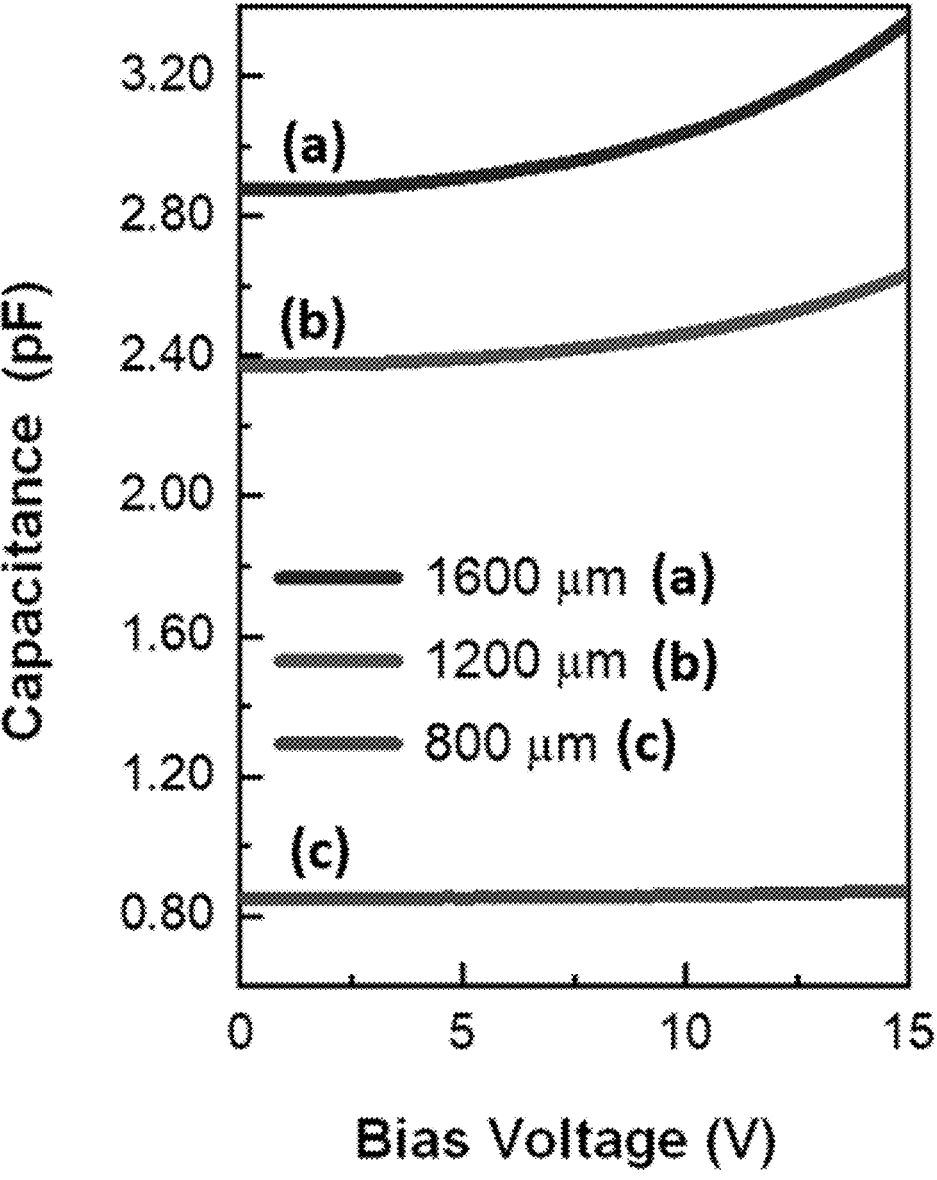
FIG. 10 is a graph showing a change in capacitance according to a voltage application of microphones manufactured according to embodiments 3 to 5.
Figure 11:
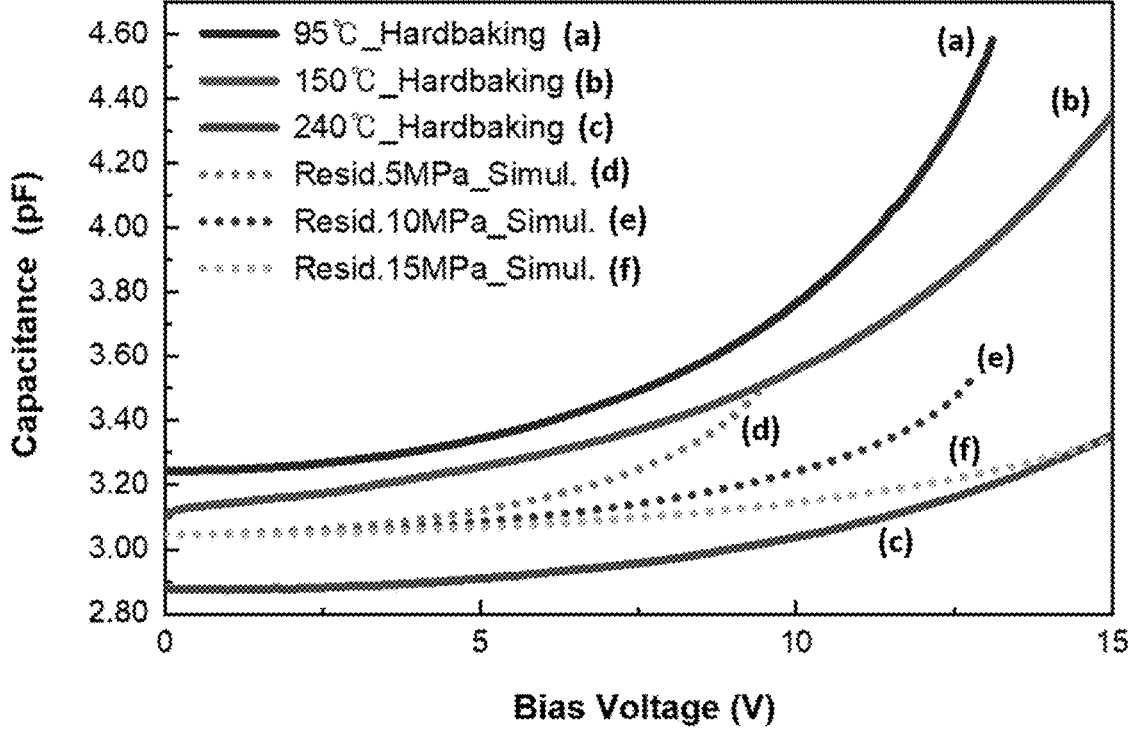
FIG. 11 is a graph showing a change in capacitance according to a voltage application of microphones manufactured according to embodiments 1 to 3.

Test Example 2: Influence of Size and Material of the Diaphragm on Sensitivity FIG. 10 is a graph showing a change in capacitance according to a voltage application of microphones manufactured according to embodiments 3 to 5, and the change in capacitance according to the voltage application for each diameter of the diaphragm is checked in FIG. 10. FIG. 11 is a graph showing a change in capacitance according to a voltage application of microphones manufactured according to embodiment 1 to 3, and the change in capacitance according to whether hard backing of the diaphragm was performed or not is checked in FIG. 11.

Specifically, when a bias voltage is applied through the first electrode part and the second electrode part of the diaphragm, the diaphragm is deflected downward by an electrostatic force, and mechanical properties of the diaphragm may be measured on the basis of the deflection. In the microphone of the present disclosure, the thickness of the diaphragm is very small compared to the diameter of the diaphragm, and a residual stress and the thickness of the diaphragm have the greatest influence on the mechanical properties of the diaphragm. Furthermore, the residual stress of the diaphragm may be predicted through the present test.

Referring to FIG. 10, it can be seen that the size of the change in capacitance due to the voltage application increases as the diameter of the diaphragm increases. In addition, even considering that an initial capacitance value increases as the diameter of the diaphragm increases, it can be seen that the degree of change in the relative capacitance is large. The mechanical properties of the diaphragm are affected by the residual stress and the thickness, and are not affected by the diameter of the diaphragm. However, the larger the diameter of the diaphragm, the larger the force the diaphragm receives within the same sound pressure. In addition, even if the deflection degree of the center of the diaphragm is the same due to the same force, the change in capacitance is significantly increased structurally.

Referring to FIG. 11, it can be seen that as the hard baking temperature of the diaphragm increases, the size of the change in capacitance according to the voltage application decreases. This is because the hard baking process has an effect of increasing the residual stress by crosslinking epoxy resin (SU-8) to strengthen the linkage between the polymers. The size of the residual stress according to the degree of hard baking was predicted by simulating the same condition. As a result, 5 MPa is predicted when the hard baking process is performed at 95 degrees Celsius for 30 minutes, 5.8 MPa is predicted when the hard baking process is performed at 150 degrees Celsius for 30 minutes, and 13 MPa is predicted when the hard baking process is performed at 240 degrees Celsius for 30 minutes.

Therefore, referring to FIG. 10 and FIG. 11, it can be seen that the larger the diameter of the diaphragm and the less hard backing, the larger the change in capacitance of the diaphragm structure due to external force.

Test Example 3: Open-Circuit Sensitivity

FIG. 12 is a graph showing open-circuit sensitivities of attachable microphones (SU-8, star shape) manufactured according to embodiments 1 to 3 and of attachable microphones (Ref. 1 to Ref. 8) described in reference papers.

The open-circuit sensitivity is a performance indicator that only informs the original mechanical properties of the diaphragm structure of the microphone, assuming that a circuit connected to the microphone is in an ideal state. An applied voltage and a distance between the diaphragm and the back plate are different for each microphone, and an applied force is standardized by an electric field in which the voltage is divided by the distance.

Referring to FIG. 12, it can be seen that the open-sensitivities of the microphones of the present disclosure are larger than that of the conventional MEMS microphones having similar structures and similar operation methods. In addition, in the microphones of the present disclosure, it can be seen that sizes of the sensitivities compared to the applied electric field are high. Such a result may be described in terms of the material and the structure of the microphone. First, epoxy resin is used as a material of the diaphragm, and has a lower residual stress than that of metal or silicon-based materials. Therefore, the diaphragm has a small stiffness even in a plate structure other than a complicated corrugated structure and a spring structure of the conventional microphone. In addition, by using the thin film transferring-based manufacturing method of the present disclosure, the microphone in which a large cylindrical hollow is formed and has a very close distance between the diaphragm and the back plate is capable of being manufactured, so that the microphone of the present disclosure has an open-circuit sensitivity larger than open-circuit sensitivities of the conventional microphones.

Figure 13:
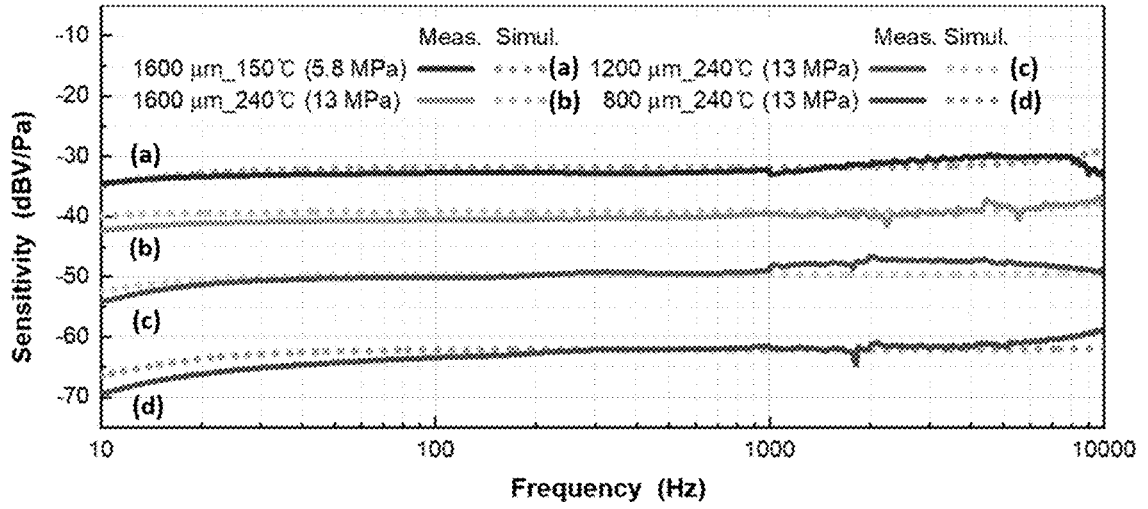
FIG. 13 is a graph showing frequency response results of sound sensitivities of microphones manufactured according to embodiments 2 to 5.

Test Example 4: Checking of the Frequency Response Rate of a Comparative Diaphragm FIG. 13 is a graph showing frequency response results of sound sensitivities of microphones manufactured according to embodiments 2 to 5, and frequency response results of sound sensitivities according to an area of the diaphragm and to whether hard backing is performed or not are checked. In the graph, an output voltage that is generated when sound pressure of a predetermined size (1 Pa) is applied to a microphone while changing a frequency is recorded, and a bandwidth of the microphone may be determined through this graph. In FIG. 13, a straight line shows a value actually measured, and a dotted line shows a simulation value.

Referring to FIG. 13, a flat frequency response curve of equal to or less than +/−3 dB can be seen from 15 Hz to 10 KHz in embodiment 3 (a diaphragm area of 1,600 μm) and in embodiment 4 (a diaphragm area of 1,200 μm). Furthermore, a flat frequency response curve of equal to or less than +/−3 dB can be seen from 34 Hz to 10 KHz in embodiment 5 (a diaphragm area of 800 μm). Since the bandwidth of the most microphone includes the audible frequency range, the presented microphone is capable of sensing well most of sounds that humans hear.

In addition, it can be seen that the larger the area of the diaphragm of the microphone and the lower the temperature of the baking process, the higher the sensitivity. That is, when the same process is performed, the amount of residual stress remaining in the thin film is the same, so that the mechanical stiffness is the same. However, as the size of the thin film increases, the total force applied to the thin film is increased, so that the distance changes more, which results in a larger change in capacitance. In addition, when the microphone is manufactured at a low baking temperature, the residual stress generated on the diaphragm is reduced, so that a lower mechanical stiffness may be secured and a higher sensitivity may be secured.

Test Example 5: Analysis of Spectral Density

Figure 14:
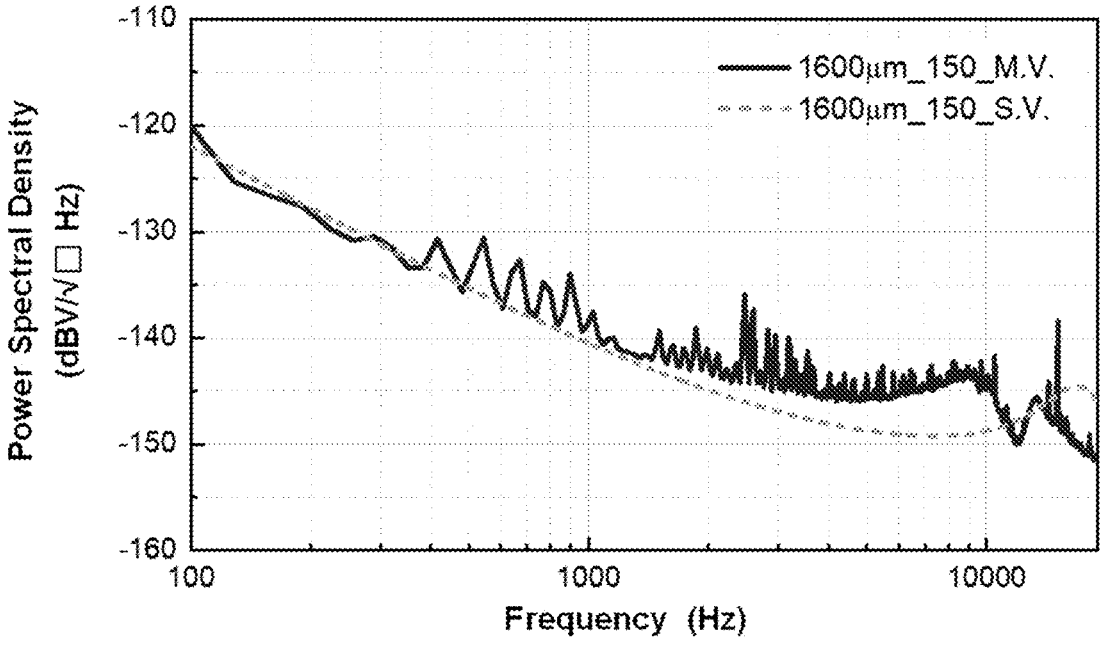
FIG. 14 is a graph showing a Power Spectral Density (PSD) of the microphone manufactured according to embodiment 2.

FIG. 14 is a graph showing a Power Spectral Density (PSD) of the microphone manufactured according to embodiment 2. In FIG. 14, an M.V. is a value actually measured, and an S.V. is a simulation value. The PSD has been measured for evaluating the final noise level including the electrical circuit, and may be secured by measuring an electrical signal that is generated without applying sound pressure in a frequency domain. The noise level of the microphone may be obtained by integrating the PSD from 20 Hz to 20 KHz. At this time, A-weighting is applied and integration is performed in order to achieve a state similar to human auditory sensing. A Signal to Noise Ratio (SNR) of the microphone may be calculated on the basis of the integrated noise value and the sensitivity at 1 KHz. When A-weighting is applied, the unit is dB (A).

Referring to FIG. 14, it can be seen that the integrated noise is 7.94 μVrms and the SNR is at the level of 65 dB (A) through the measured sensitivity.

Test Example 6: Checking of Sensitivity Linearity

Figure 15:
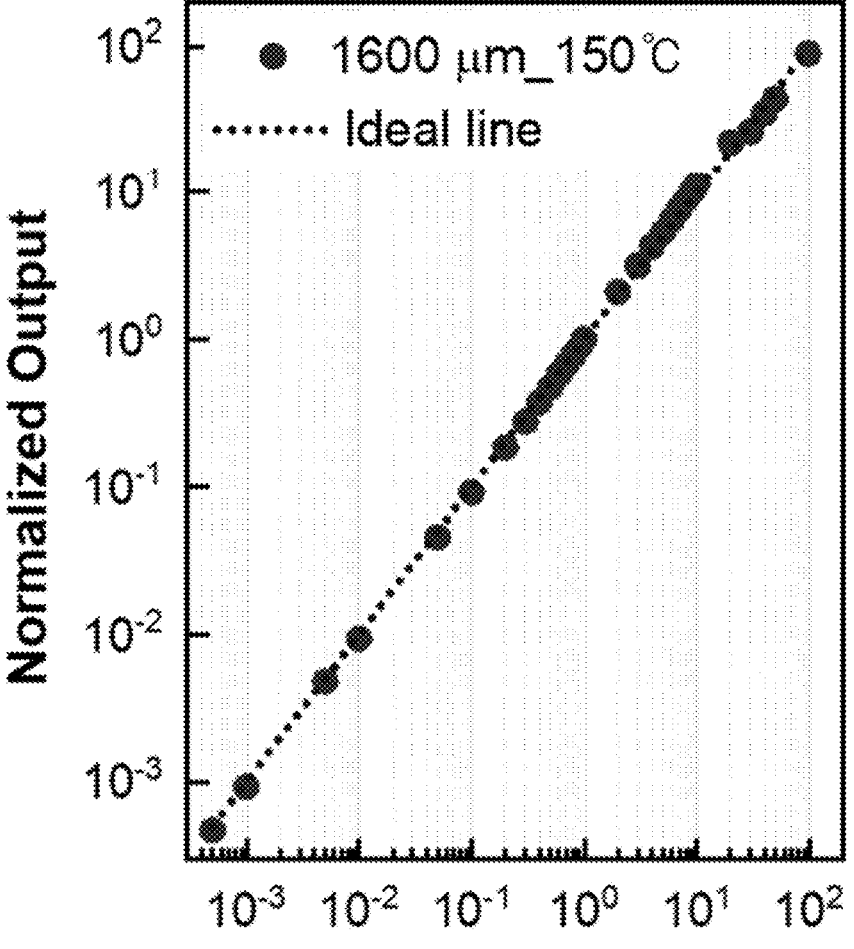
FIG. 15 is a graph showing a linearity evaluation of a sound sensitivity from 28 dB to 134 dB of the microphone manufactured according to embodiment 2.

FIG. 15 is a graph showing a linearity evaluation of a sound sensitivity from 28 dB to 134 dB of the microphone manufactured according to embodiment 2.

Referring to FIG. 15, in the microphone manufactured according to embodiment 2, it can be seen that an electrical signal output according to sound pressure is linear with an input sound pressure.

Test Example 7: Analysis of Total Harmonic Distortion

Figure 18:
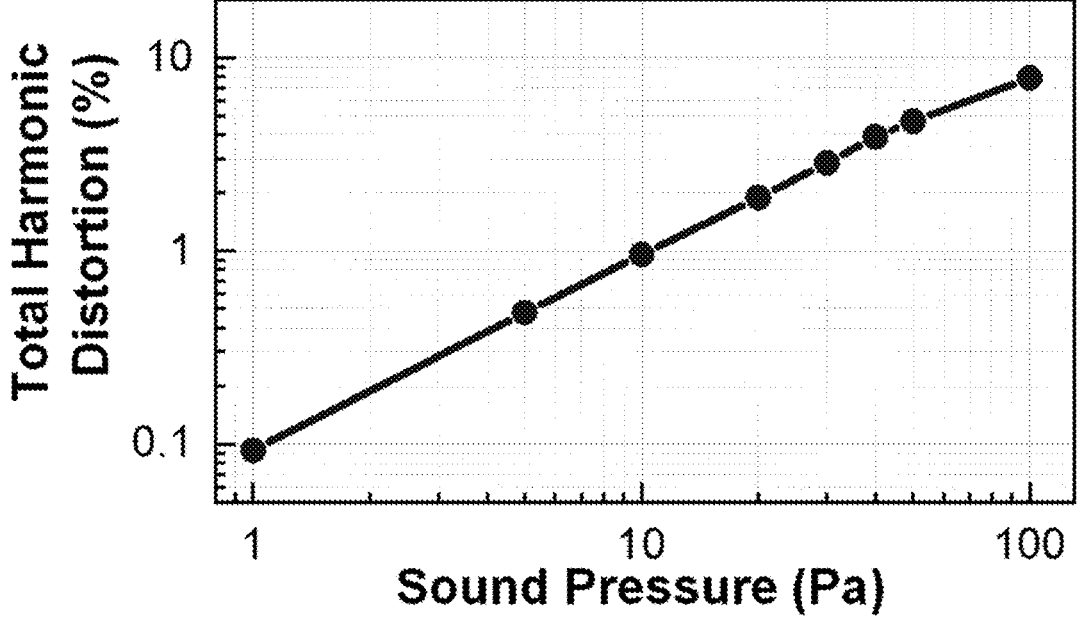
FIG. 18 is a graph showing a result of determining the degree of total harmonic distortion for large sound pressure (sound) of the microphone manufactured according to embodiment 2.

FIG. 18 is a graph showing a result of determining the degree of total harmonic distortion for large sound pressure (sound) of the microphone manufactured according to embodiment 2.

The Total Harmonic Distortion (THD) is an indicator in which the degree of distortion of a waveform sensed by a microphone can be known. When an input sound pressure is a pure sine wave function, an electrical signal output from the microphone is required to be a pure sine wave function. However, due to various reasons, distortion occurs in the sensor.

In a distorted signal, in addition to a fundamental frequency, harmonics of the fundamental frequency are generated. At this time, the harmonics distort the signal. The THD indicates a ratio of a signal size of the harmonics to a signal size at the fundamental frequency. The smaller the THD size, the better sound quality recording is capable of being performed.

In the MEMS microphone, a point at which the THD reaches 10 percent is designated as an Acoustic Overload Point (AOP), and the AOP indicates the maximum sound pressure that the microphone can measure.

Referring to FIG. 18, in the microphone manufactured according to embodiment 2, the THD of about 8% at 100 Pa (134 dB$_{SPL}$) is measured, which means that the proposed microphone is capable of measuring sound up to a large sound pressure of 100 Pa.

Test Example 8: Analysis of Thermal Stability

Figure 19:
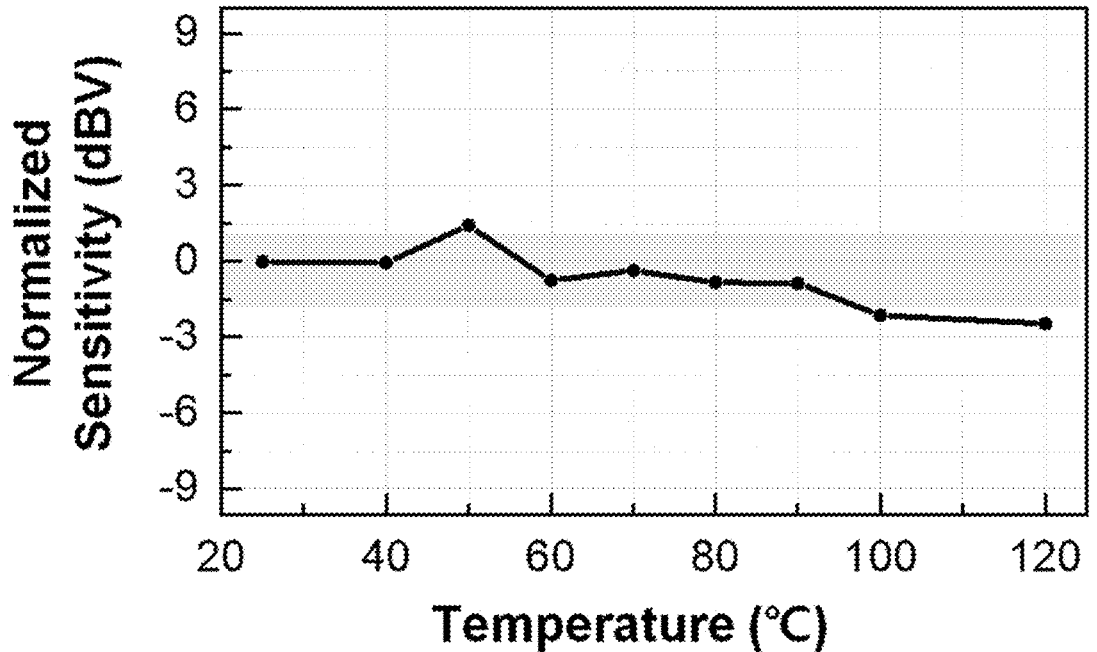
FIG. 19 is a graph showing a thermal stability of the microphone manufactured according to embodiment 2.

FIG. 19 is a graph showing a thermal stability of the microphone manufactured according to embodiment 2.

In order for the microphone to be applied in real life, stability with respect to temperature is required to be secured. Referring to FIG. 19, the microphone manufactured according to the present disclosure may be used within a sensitivity change of less than 3 dB up to 90 degrees Celsius.

Test Example 9: Sensitivity Comparison Per Unit Area

FIG. 16 is a graph showing a comparison of a sensitivity per unit area of the attachable microphone (This work) manufactured according to an embodiment of the present disclosure, a conventional commercial MEMS microphone (Ref. 1), and flexible microphones (Ref. 2 to Ref. 9) described in reference papers. In order to stably attach a microphone to a surface that is rough or curved like skin, the microphone is required to have a small size and a high sound sensing performance. Therefore, the performance was compared on the basis of the sensitivity per unit area.

Referring to FIG. 16, the attachable sound sensors (Ref. 2 to Ref. 9) previously researched and developed are mostly configured to sense sound by using resonant vibration at a specific frequency rather than all audible frequencies. Although the attachable sound sensors (Ref. 2 to Ref. 9) have sensitivities of several volts per 1 Pa (94 dB), sensitivities per unit area are only about 10 mV/Pa/mm$^2$ at most due to large areas, and have sensing performances lower than a sensing performance of the commercial MEMS microphone (Ref. 1). This means that when the commercial MEMS microphone is manufactured in an array such as a sensing area of the attachable sound sensor, the commercial MEMS microphone may have a larger sensitivity.

On the other hand, the microphone (This work) of the present disclosure has a high sensitivity at the level of a sensitivity of the commercial MEMS microphone (Ref. 1) even considering the unit area. The reason why the microphone (This work) of the present disclosure has the high sensitivity is because, unlike the conventional MEMS microphones manufactured using silicon materials, the microphone (This work) was manufactured by using organic materials.

Test Example 10: Comparison of Sound Pressure and Frequency Range Having Constant Sensitivity FIG. 17 is a graph showing a comparison of sound pressure and a bandwidth of the attachable microphone (This work) manufactured according to an embodiment of the present disclosure, a conventional commercial MEMS microphone (MP23ABS1, Infineon), a commercial electret condenser microphone (BO6034L-423, JLI Electronics Inc.), and flexible sound sensors (Ref. 1 to Ref. 6) described in reference papers. A wider range of sound pressure and frequency means that various voices such as smaller voices, larger voices, lower-pitched voices, and higher-pitched voices are capable of being sensed. Therefore, it can be said that the wider the range, the better the sensing performance.

Referring to FIG. 13, FIG. 14, FIG. 15, FIG. 18, and FIG. 19, the SNR of the attachable microphone manufactured according to an embodiment of the present disclosure is 65 dB (A), the AOP is 134 dB, and the frequency response rate is 15 Hz to 10 KHz. Accordingly, "This work" in FIG. 17 can be indicated on the basis of the SNR value, the AOP value, and the frequency response rate.

Referring to FIG. 17, since the flexible sound sensors developed so far mainly use only sound sensing at resonant frequencies, a frequency range having a constant sensitivity is very narrow, and a sound pressure range having a constant sensitivity is not wide. However, the microphone of the present disclosure has a wider range of sound pressure and frequency having a slightly constant sensitivity than that of the conventional MEMS microphone or the electret condenser microphone. Therefore, it can be said that the microphone developed in the present disclosure has a commercially available level of sensing performance that is not realized by the conventional flexible sound sensors.

Test Example 11: Sound Pressure Sensing Comparison

FIG. 20 shows results of comparing sound sensing characteristics of the microphone manufactured according to embodiment 1, a MEMS microphone mounted in an iphone XR, and an AT2035 microphone manufactured by Audio-Technica in terms of the sound waveforms and frequency spectrums thereof.

Figure 20A:
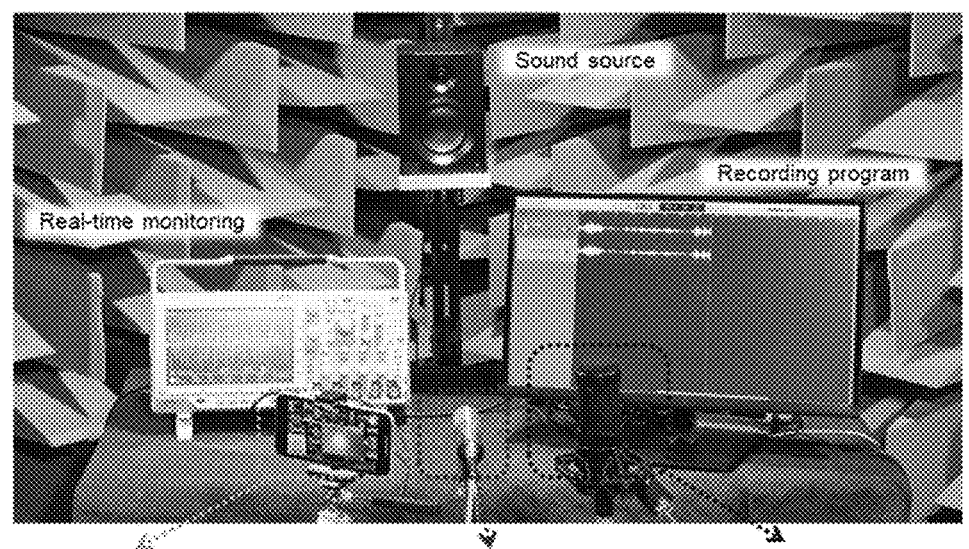
FIG. 20*a* is a photograph in which an experiment was conducted to identify sound sensing characteristics of the microphone manufactured according to embodiment 1, a MEMS microphone mounted in an iphone XR, and an AT2035 microphone manufactured by Audio-Technica.

As illustrated in FIG. 20a, in an anechoic room, the attachable microphones of the present disclosure and the conventional microphones are positioned to be spaced apart from each other by a predetermined distance from a speaker that is a sound source, and sound pressure that flows from the sound source is sensed and recorded at the same time.

Particularly, a real-time sound pressure wave sensed by the microphone of the present disclosure has been confirmed with an oscilloscope, and the real-time recording has been confirmed through a recording program.

Figure 20B:
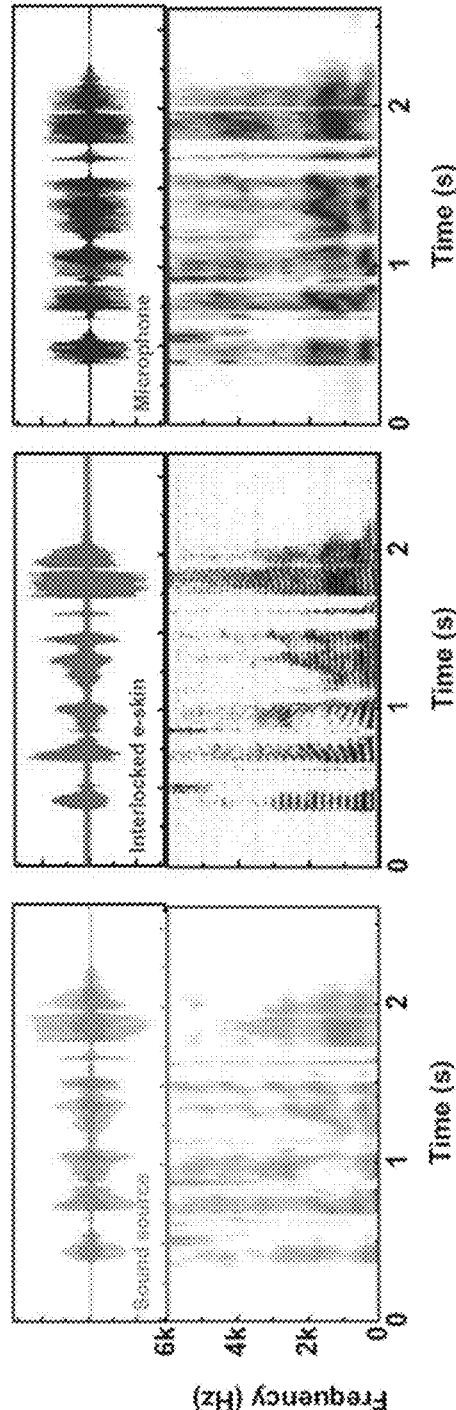
FIG. 20*b* shows graphs showing results of comparing sound sensing characteristics of the microphone manufactured according to embodiment 1, the MEMS microphone mounted in the iphone XR, and the AT2035 microphone manufactured by Audio-Technica in terms of the sound waveforms and frequency spectrums thereof.

Referring to FIG. 20b, the acoustic pressure waveform and the frequency spectrum thereof when the sound pressure is simultaneously detected by the attachable microphone of the present disclosure and the conventional microphones may be identified. In the attachable microphone of the present disclosure, it is possible to confirm that the microphone of the present disclosure senses the sound pressure in the same manner as the conventional MEMS microphone and the recording condenser microphone.

Therefore, it can be seen that the microphone of the present disclosure has a sound sensing performance at a commercial level beyond a sound sensing performance at a level of simply sensing a voice.

The scope of the present disclosure is represented by the following claims, rather than the detailed description, and it is to be construed that the meaning and scope of the claims and all variations or modified forms derived from the equivalent concept thereof are encompassed within the scope of the present disclosure.

DESCRIPTION OF REFERENCE NUMERALS

10: attachable microphone
100: substrate
110: back chamber
120: first frame member
200: back plate part
210: first through hole
220: back plate
300: first electrode part
310: second through hole
320: first electrode member
400: support part
410: front chamber
420: second frame member
500: second electrode part
510: second electrode member
600: diaphragm
610: thin film
700: adhesive part
800: attachment layer

INDUSTRIAL APPLICABILITY

The attachable microphone of the present disclosure has a high and constant sensitivity within an audible frequency range (15 Hz to 10,000 Hz) and a size range (29 dB$_{SPL}$ to 123 dB$_{SPL}$), and is capable of being attached to various surfaces including skin, a curved surface, and so on.

In addition, the attachable microphone of the present disclosure is capable of being attached to various surfaces such as skin, a curved surface, and so on the basis of being made of an organic material and having a thin film shape having a thin and small structure.

In addition, since the attachable microphone and the manufacturing method therefor apply the thin film transferring-based manufacturing method and the polymer material that costs less than the conventional silicon material, there is an economical effect in terms of time and cost compared to the silicon-based manufacturing process of the conventional MEMS microphone.

FIG. 12 is a graph showing open-circuit sensitivities of attachable microphones (SU-8, star shape) manufactured according to embodiments of the present disclosure and of attachable microphones (Ref. 1 to Ref. 8) described in reference papers. Referring to FIG. 12, it can be seen that the open-sensitivities of the microphones of the present disclosure are larger than that of the conventional MEMS microphones having similar structures and similar operation methods. In addition, in the microphones of the present disclosure, it can be seen that sizes of the sensitivities compared to the applied electric field are high. Such a result may be described in terms of the material and the structure of the microphone. First, epoxy resin is used as a material of the diaphragm, and has a lower residual stress than that of metal or silicon-based materials. Therefore, the diaphragm has a small stiffness even in a plate structure rather than a complicated corrugated structure and a spring structure of the conventional microphone. In addition, by using the thin film transferring-based manufacturing method of the present disclosure, the microphone in which a large cylindrical hollow is formed and in which the distance between the diaphragm and the back plate is small is capable of being manufactured, so that the microphone of the present disclosure has an open-circuit sensitivity greater than open-circuit sensitivities of the conventional microphones.

FIG. 16 is a graph showing a comparison of a sensitivity per unit area of the attachable microphone (This work) manufactured according to an embodiment of the present disclosure, a conventional commercial MEMS microphone (Ref. 1), and flexible microphones (Ref. 2 to Ref. 9) described in reference papers. In order to stably attach a microphone to a surface that is rough or curved like skin, the microphone is required to have a small size and a high sound sensing performance. Therefore, the performance was compared on the basis of the sensitivity per unit area.

Referring to FIG. 16, the attachable sound sensors (Ref. 2 to Ref. 9) previously researched and developed are mostly configured to sense sound by using resonant vibration at a specific frequency rather than all audible frequencies. Although the attachable sound sensors (Ref. 2 to Ref. 9) have sensitivities of several volts per 1 Pa (94 dB), sensitivities per unit area are only about 10 mV/Pa/mm$^2$ at most due to large areas, and have sensing performances lower than a sensing performance of the commercial MEMS microphone (Ref. 1). This means that when the commercial MEMS microphone is manufactured as an array such as a sensing area of the attachable sound sensor, the commercial MEMS microphone may have a larger sensitivity.

On the other hand, the microphone (This work) of the present disclosure has a sensitivity higher than a sensitivity of the commercial MEMS microphone (Ref. 1) even considering the unit area. The reason why the microphone (This work) of the present disclosure has the high sensitivity is because, unlike the conventional MEMS microphones manufactured using silicon materials, the microphone (This work) was manufactured by using organic materials.

FIG. 17 is a graph showing a comparison of sound pressure and a bandwidth of the attachable microphone (This work) manufactured according to an embodiment of the present disclosure, a conventional commercial MEMS microphone (MP23ABS1, Infineon), a commercial electret condenser microphone (BO6034L-423, JLI Electronics Inc.), and flexible sound sensors (Ref. 1 to Ref. 6) described in reference papers. A wider range of sound pressure and frequency means that various voices such as smaller voices, larger voices, lower-pitched voices, and higher-pitched voices are capable of being sensed. Therefore, it can be said that the wider the range, the better the sensing performance.

Referring to FIG. 17, since the flexible sound sensors developed so far mainly use only sound sensing at resonant frequencies, a frequency range having a constant sensitivity is very narrow, and a sound pressure range having a constant sensitivity is not wide. However, the microphone of the present disclosure has a wider range of sound pressure and frequency having a slightly constant sensitivity than that of the conventional MEMS microphone or the electret condenser microphone. Therefore, it can be said that the microphone developed in the present disclosure has a commercially available level of sensing performance that is not realized by the conventional flexible sound sensors.

The invention claimed is:

1. An attachable microphone comprising:
a substrate including a back chamber that has a first cylindrical hollow, the substrate including a first frame member which surrounds the back chamber and which includes a first polymer or an inorganic material;
a back plate part disposed on the substrate, the back plate part including a plurality of first through holes and including a back plate that includes a second polymer;
a first electrode part disposed on the back plate part, the first electrode part having a plurality of second through holes and including a first electrode member;
a support part disposed on the first electrode part, the support part including a front chamber having a second cylindrical hollow, and the support part including a second frame member which includes a third polymer and which surrounds the front chamber;
a second electrode part disposed on the support part, the second electrode part including a second electrode member; and
a diaphragm disposed on the second electrode part, the diaphragm including a thin film that includes a fourth polymer,
wherein the attachable microphone further comprises an adhesive part including an adhesive agent, and
the adhesive part penetrates the back plate part and the first electrode part, and the adhesive part respectively adheres the substrate and the support part.

2. The attachable microphone of claim 1, wherein the back chamber include any one shape selected from the group consisting of a cylindrical shape, an elliptical cylindrical shape, a polygonal cylindrical shape, a star-like cylindrical shape, and a combination thereof.

3. The attachable microphone of claim 1, wherein a size of a diameter of the first cylindrical hollow is 1 to 1.5 times a size of a diameter of the second cylindrical hollow of the support part.

4. The attachable microphone of claim 1, wherein a height of the first cylindrical hollow is 0.01 mm to 1 mm.

5. The attachable microphone of claim 1, wherein an area of the first cylindrical hollow from an upper part of the first cylindrical hollow to a lower part of the first cylindrical hollow is the same or increases.

6. The attachable microphone of claim 1, wherein the attachable microphone further comprises an attachment layer positioned on the substrate in a direction opposite to the back plate part, and
a thickness of the attachment layer is 0.01 mm to 1 mm.

7. The attachable microphone of claim 1, wherein the first polymer comprises at least one selected from the group consisting of polyparaxylylene (parylene, poly (p-xylylene)), polyethylene terephthalate, polybutylene terephthalate, polyethylene naphthalate, polyethylene, polypropylene, polystyrene, polycarbonate, polyamide, polyimide, polyurea, polyurethane, polydimethylsiloxane, polystyrene butadiene styrene, polystyrene ethylene butylene styrene, polymethyl methacrylate, acrylonitrile butadiene styrene resin, epoxy resin, acrylic resin, novolac resin, formaldehyde resin, phenolic resin, phenol-formaldehyde resin, polyester resin, bismaleimide triazine resin, polyimide resin, diphenylene ether resin, polycyanate resin, polyolefin resin, and imide-styrene resin, and
the inorganic material comprises at least one selected from the group consisting of silicon, silicon nitride, and silicon oxide.

8. The attachable microphone of claim 1, wherein the second polymer, the third polymer, and the fourth polymer is the same or different from each other, and independently comprise at least one selected from the group consisting of epoxy resin, acrylic resin, novolac resin, formaldehyde resin, polymethyl methacrylate, polyparaxylylene (parylene, poly (p-xylylene)), polyethylene terephthalate, polybutylene terephthalate, polyethylene naphthalate, polyethylene, polypropylene, polystyrene, polycarbonate, polyamide, polyimide, polyurea, polyurethane, polydimethylsiloxane, polystyrene butadiene styrene, polystyrene-acrylate copolymer, polystyrene ethylene butylene styrene, and polyacrylonitrile butadiene styrene.

9. The attachable microphone of claim 1, wherein a gap between adjacent through holes among the plurality of through holes in the back plate part is 15 µm to 150 µm, and a diameter of each of the plurality of through holes is 10 µm to 100 µm.

10. The attachable microphone of claim 1, wherein a thickness of the back plate part is 10 µm to 500 µm, a thickness of the support part is 0.1 µm to 20 µm, and a thickness of the diaphragm is 0.1 µm to 10 µm.

11. The attachable microphone of claim 1, wherein a Young's modulus of the back plate is at least 100 MPa, and a Young's modulus of the thin film is 1 MPa to 10 GPa.

12. The attachable microphone of claim 1, wherein the plurality of first through holes of the back plate part is in contact with the plurality of second through holes of the first electrode part, a height direction of the first through holes is perpendicular to a surface of the first electrode part, the second cylindrical hollow of the front chamber is in contact with the second electrode part, and a height direction of the second cylindrical hollow is perpendicular to the surface of the first electrode part and to a surface of the second electrode part.

13. The attachable microphone of claim 1, wherein a diameter of the second cylindrical hollow is 50 µm to 3,000 µm.

14. The attachable microphone of claim 1, wherein the first electrode member and the second electrode member is the same or different from each other, and independently comprise at least one selected from the group consisting of gold, titanium, platinum, silver, nickel, palladium, copper, zinc, cadmium, iron, cobalt, iridium, tin, gallium, aluminum, manganese, chromium, molybdenum, tungsten, graphene, carbon nanotube, graphite, indium tin oxide, and PEPOT: PSS.

15. The attachable microphone of claim 1, wherein the attachable microphone has a horizontal length of 1.4 mm to 10 mm, a vertical length of 1.4 mm to 10 mm, and a thickness of 50 μm to 5 mm.

16. A microphone array comprising a plurality of attachable microphones according to claim 1.

17. A manufacturing method for an attachable microphone, the manufacturing method comprising:

(a) a process of fabricating a substrate which includes a back chamber having a first cylindrical hollow and which includes a first frame member surrounding the back chamber and including a first polymer;

(b) a process of fabricating a lower plate including a back plate part and a first electrode part, the back plate part including a plurality of first through holes and a back plate that includes a second polymer, the first electrode part being disposed on the back plate part and including a plurality of second through holes and a first electrode member;

(c) a process of fabricating an upper plate including a support part, a second electrode part, and a diaphragm, the support part including a front chamber that has a second cylindrical hollow and including a second frame member which includes a third polymer and which surrounds a front chamber, the second electrode part being disposed on the support part and including a second electrode member, the diaphragm being disposed on the second electrode part and including a thin film that includes a fourth polymer; and (d) a process of fabricating the attachable microphone having a substrate/lower plate/upper plate structure by using thin film transferring, wherein the process (d) is a process of forming the substrate/lower plate/upper plate structure by using thin film transferring and of fabricating the attachable microphone by forming an adhesive part that includes an adhesive agent, the adhesive part penetrates the back plate part and the first electrode part, and the adhesive part respectively adheres the substrate and the support part.

18. The manufacturing method of claim 17, wherein the process (b) comprises:

(b-1) a process in which a sacrificial layer is formed on a base, and the back plate part having the plurality of first through holes and having the back plate that includes the second polymer is formed on the sacrificial layer, thereby forming a base/sacrificial layer/back plate part structure;

(b-2) a process of forming the single back plate part by etching the sacrificial layer of the base/sacrificial layer/ back plate part structure; and (b-3) a process in which the first electrode part having the plurality of second through holes and the first electrode member is formed on the back plate part, thereby forming the lower plate having the back plate part and the first electrode part.

* * * * *